(12) United States Patent
Venugopal et al.

(10) Patent No.: US 10,790,228 B2
(45) Date of Patent: Sep. 29, 2020

(54) INTERCONNECT VIA WITH GROWN GRAPHITIC MATERIAL

(71) Applicant: TEXAS INSTRUMENTS INCORPORATED, Dallas, TX (US)

(72) Inventors: Archana Venugopal, Dallas, TX (US); Benjamin Stassen Cook, Rockwall, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/372,455

(22) Filed: Apr. 2, 2019

(65) Prior Publication Data

US 2019/0229051 A1 Jul. 25, 2019

Related U.S. Application Data

(62) Division of application No. 15/361,401, filed on Nov. 26, 2016, now Pat. No. 10,256,188.

(51) Int. Cl.
*H01L 23/528* (2006.01)
*H01L 23/522* (2006.01)
(Continued)

(52) U.S. Cl.
CPC .......... *H01L 23/528* (2013.01); *H01L 21/288* (2013.01); *H01L 21/28556* (2013.01);
(Continued)

(58) Field of Classification Search
CPC ......... H01L 21/76876; H01L 21/76879; H01L 21/76885; H01L 21/76895;
(Continued)

(56) References Cited

U.S. PATENT DOCUMENTS 5,224,030 A 6/1993 Banks et al.
5,481,136 A 1/1996 Kohmoto et al.
(Continued)

FOREIGN PATENT DOCUMENTS

CN 105419345 3/2016
JP 2002088257 3/2002
(Continued)

OTHER PUBLICATIONS

Sabine Szunerits, et al.; "Diamond Nanowires" A Novel Platform for Electrochemistry and Matrix-Free Mass Spectrometry; Sensors; ISSN 1424-8220; www.mdpi.com/journal/sensors; Apr. 19, 2015; Published: May 27, 2015; pp. 12573-12593.
(Continued)

*Primary Examiner* — Syed I Gheyas
(74) *Attorney, Agent, or Firm* — Andrew R. Ralston; Charles A. Brill; Frank D. Cimino

(57) ABSTRACT

An integrated circuit has a substrate and an interconnect region disposed on the substrate. The interconnect region includes a plurality of interconnect levels. Each interconnect level includes interconnects in dielectric material. The integrated circuit includes a graphitic via in the interconnect region. The graphitic via vertically connects a first interconnect in a first interconnect level to a second interconnect in a second, higher, interconnect level. The graphitic via includes a cohered nanoparticle film of nanoparticles in which adjacent nanoparticles cohere to each other, and a layer of graphitic material disposed on the cohered nanoparticle film. The nanoparticles include one or more metals suitable for catalysis of the graphitic material. The cohered nanoparticle film is formed by a method which includes an additive process. The graphitic via is electrically coupled to an active component of the integrated circuit.

20 Claims, 20 Drawing Sheets

(51) Int. Cl.

| | |
|---|---|
| *H01L 23/532* | (2006.01) |
| *H01L 23/31* | (2006.01) |
| *H01L 21/288* | (2006.01) |
| *H01L 23/367* | (2006.01) |
| *H01L 23/373* | (2006.01) |
| *H01L 21/768* | (2006.01) |
| *H01L 21/3105* | (2006.01) |
| *H01L 21/324* | (2006.01) |
| *H01L 21/285* | (2006.01) |
| *H01L 21/3205* | (2006.01) |
| *H01L 23/48* | (2006.01) |

(52) U.S. Cl.
CPC ...... *H01L 21/31051* (2013.01); *H01L 21/324* (2013.01); *H01L 21/32051* (2013.01); *H01L 21/32055* (2013.01); *H01L 21/76802* (2013.01); *H01L 21/76834* (2013.01); *H01L 21/76876* (2013.01); *H01L 21/76879* (2013.01); *H01L 21/76885* (2013.01); *H01L 21/76895* (2013.01); *H01L 23/3107* (2013.01); *H01L 23/3677* (2013.01); *H01L 23/373* (2013.01); *H01L 23/481* (2013.01); *H01L 23/5226* (2013.01); *H01L 23/5227* (2013.01); *H01L 23/53209* (2013.01); *H01L 23/53276* (2013.01); *H01L 21/28562* (2013.01); *H01L 2224/48463* (2013.01)

(58) Field of Classification Search
CPC ......... H01L 21/76834; H01L 21/76802; H01L 21/32055; H01L 21/32051; H01L 21/28556; H01L 21/324; H01L 21/31051; H01L 21/288; H01L 21/28562
See application file for complete search history.

(56) References Cited

U.S. PATENT DOCUMENTS

| | | | |
|---|---|---|---|
| 5,683,939 A | 11/1997 | Schrantz et al. | |
| 6,046,503 A | 4/2000 | Weigand et al. | |
| 6,100,199 A | 8/2000 | Joshi et al. | |
| 6,242,807 B1 | 6/2001 | Kazami | |
| 6,265,771 B1 | 7/2001 | Ference et al. | |
| 6,288,426 B1 | 9/2001 | Gauthier, Jr. et al. | |
| 6,646,340 B2 | 11/2003 | Deeter et al. | |
| 6,771,502 B2 | 8/2004 | Getz, Jr. et al. | |
| 6,773,952 B2 | 8/2004 | Armbrust et al. | |
| 6,800,886 B2 * | 10/2004 | Awano | B82Y 10/00 257/276 |
| 7,071,603 B2 | 7/2006 | Ha et al. | |
| 7,161,239 B2 | 1/2007 | Zhao et al. | |
| 7,189,778 B2 | 3/2007 | Tobita et al. | |
| 7,260,939 B2 | 8/2007 | Weater, Jr. | |
| 7,264,869 B2 | 9/2007 | Tobita et al. | |
| 7,286,359 B2 | 10/2007 | Khbeis et al. | |
| 7,312,531 B2 * | 12/2007 | Chang | H01L 21/76849 257/770 |
| 7,345,364 B2 | 3/2008 | Kerr et al. | |
| 7,473,633 B2 | 1/2009 | Furukawa et al. | |
| 7,560,310 B2 | 7/2009 | Hsu et al. | |
| 7,572,680 B2 | 8/2009 | Hess et al. | |
| 7,586,191 B2 | 9/2009 | Hall et al. | |
| 7,633,152 B2 | 12/2009 | Lee et al. | |
| 7,642,641 B2 | 1/2010 | Mahler et al. | |
| 7,773,973 B2 | 7/2010 | Bratkovski et al. | |
| 7,768,121 B2 | 8/2010 | Colgan et al. | |
| 7,772,692 B2 | 8/2010 | Takamatsu et al. | |
| 7,825,498 B2 | 11/2010 | Haga et al. | |
| 7,859,087 B2 | 12/2010 | Murata et al. | |
| 7,989,349 B2 | 8/2011 | Sandhu et al. | |
| 8,022,532 B2 | 9/2011 | Kasuya et al. | |
| 8,106,497 B2 | 1/2012 | Brunnbauer | |
| 8,130,500 B2 | 3/2012 | Oda | |
| 8,134,231 B2 | 3/2012 | Sano et al. | |
| 8,148,820 B2 | 4/2012 | Sato | |
| 8,248,803 B2 | 8/2012 | Lin et al. | |
| 8,277,613 B2 | 10/2012 | Smith et al. | |
| 8,410,474 B2 | 4/2013 | Okai et al. | |
| 8,440,999 B2 | 5/2013 | Dimitrakopoulos et al. | |
| 8,462,511 B2 | 6/2013 | Lee | |
| 8,466,054 B2 | 6/2013 | Stuber et al. | |
| 8,470,701 B2 | 6/2013 | Rogers et al. | |
| 8,486,824 B2 | 7/2013 | Tee et al. | |
| 8,524,539 B2 | 9/2013 | Lee et al. | |
| 8,535,758 B2 | 9/2013 | Bulovic | |
| 8,552,554 B2 | 10/2013 | Tain et al. | |
| 8,558,372 B2 | 10/2013 | Negoro | |
| 8,587,064 B2 | 11/2013 | Warabino | |
| 8,637,388 B2 | 1/2014 | Abou-khali et al. | |
| 8,664,759 B2 | 3/2014 | Ryan | |
| 8,836,110 B2 | 9/2014 | Chopin et al. | |
| 8,865,577 B2 | 10/2014 | Wei et al. | |
| 8,866,276 B2 | 10/2014 | Su et al. | |
| 8,866,294 B2 | 10/2014 | Pagaila et al. | |
| 8,901,613 B2 | 12/2014 | Sekar et al. | |
| 8,937,376 B2 | 1/2015 | Tsai | |
| 8,940,628 B2 | 1/2015 | Yamazaki et al. | |
| 9,013,035 B2 | 4/2015 | Zhao et al. | |
| 9,093,428 B2 | 7/2015 | Liang | |
| 9,099,375 B2 | 8/2015 | Kub et al. | |
| 9,165,721 B2 | 10/2015 | Lee et al. | |
| 9,171,779 B2 | 10/2015 | Lin et al. | |
| 9,245,813 B2 | 1/2016 | Bartley et al. | |
| 9,308,731 B2 | 4/2016 | Williams | |
| 9,331,283 B2 | 5/2016 | Lim et al. | |
| 9,349,838 B2 | 5/2016 | Cheng et al. | |
| 9,349,975 B2 | 5/2016 | Coe-sullivan et al. | |
| 9,362,198 B2 | 6/2016 | Viswanathan | |
| 9,397,023 B2 | 7/2016 | Venugopal et al. | |
| 9,401,315 B1 | 7/2016 | Bodenweber | |
| 2001/0035578 A1 | 11/2001 | Liang et al. | |
| 2003/0064017 A1 | 4/2003 | Tobitha et al. | |
| 2003/0122215 A1 | 7/2003 | Wilson | |
| 2004/0102597 A1 | 5/2004 | Tobitha et al. | |
| 2005/0079120 A1 | 4/2005 | Fujita et al. | |
| 2005/0133863 A1 | 6/2005 | Werner et al. | |
| 2006/0121710 A1 | 6/2006 | Liang et al. | |
| 2006/0289988 A1 | 12/2006 | Ryan | |
| 2007/0001292 A1 | 1/2007 | Ohta et al. | |
| 2007/0126116 A1 | 6/2007 | Dangelo et al. | |
| 2008/0047484 A1 | 2/2008 | Sung | |
| 2009/0162954 A1 | 6/2009 | Griffin et al. | |
| 2009/0218682 A1 | 9/2009 | Lundberg | |
| 2010/0140790 A1 | 6/2010 | Setiadi et al. | |
| 2010/0207277 A1 | 8/2010 | Bauer et al. | |
| 2011/0039357 A1 | 2/2011 | Lin et al. | |
| 2011/0140232 A1 | 6/2011 | Gaul et al. | |
| 2011/0260303 A1 | 10/2011 | Pagaila et al. | |
| 2011/0272824 A1 | 11/2011 | Pagaila et al. | |
| 2012/0025269 A1 | 2/2012 | Parkhurst et al. | |
| 2012/0042922 A1 | 2/2012 | Kondo et al. | |
| 2012/0086132 A1 | 4/2012 | Kim et al. | |
| 2012/0141678 A1 | 6/2012 | Sumerel | |
| 2013/0127037 A1 | 5/2013 | Mori et al. | |
| 2013/0160701 A1 | 6/2013 | Arnold et al. | |
| 2014/0008756 A1 | 1/2014 | Pei et al. | |
| 2014/0014975 A1 | 1/2014 | Bae et al. | |
| 2014/0057393 A1 | 2/2014 | Bonart | |
| 2014/0131860 A1 | 5/2014 | Kanda et al. | |
| 2014/0321026 A1 | 10/2014 | Hermann et al. | |
| 2014/0321093 A1 | 10/2014 | Pande et al. | |
| 2015/0008525 A1 | 1/2015 | Fukuzaki et al. | |
| 2015/0084103 A1 | 3/2015 | Okazaki et al. | |
| 2015/0129190 A1 | 5/2015 | Lin | |
| 2015/0136357 A1 | 5/2015 | Johnson | |
| 2015/0152239 A1 | 6/2015 | Guilera et al. | |
| 2015/0159969 A1 | 6/2015 | Lu et al. | |
| 2015/0162346 A1 | 6/2015 | Choi et al. | |
| 2015/0166921 A1 | 6/2015 | Erdemir et al. | |
| 2015/0187678 A1 | 7/2015 | Park et al. | |
| 2015/0218694 A1 | 8/2015 | Xu et al. | |
| 2015/0228628 A1 | 8/2015 | Pagaila et al. | |

(56) References Cited

U.S. PATENT DOCUMENTS

| | | |
|---|---|---|
| 2015/0237762 A1 | 8/2015 | Holt et al. |
| 2015/0255451 A1 | 9/2015 | Yasusaka |
| 2015/0270356 A1 | 9/2015 | Palacios et al. |
| 2015/0315442 A1 | 11/2015 | Hofius |
| 2015/0325524 A1 | 11/2015 | Wada et al. |
| 2015/0325531 A1 | 11/2015 | Dyer et al. |
| 2015/0348865 A1 | 12/2015 | Vincent et al. |
| 2016/0152794 A1 | 6/2016 | Diaham et al. |
| 2016/0197027 A1 | 7/2016 | Nasser-faili |
| 2016/0215172 A1 | 7/2016 | Morita et al. |
| 2016/0291256 A1 | 10/2016 | Rollinger |
| 2016/0379960 A1 | 12/2016 | Huang et al. |
| 2016/0380090 A1 | 12/2016 | Roberts et al. |
| 2017/0338214 A1 | 11/2017 | Uzoh et al. |

FOREIGN PATENT DOCUMENTS

| | | |
|---|---|---|
| JP | 2002097371 | 4/2002 |
| JP | 3159040 | 5/2010 |
| JP | 2010205955 | 9/2010 |
| JP | 2016000506 | 1/2016 |
| KR | 20130088223 | 8/2013 |
| KR | 20140132961 | 11/2014 |
| KR | 20140142382 | 12/2014 |

OTHER PUBLICATIONS

Awano et al., Carbon Nanotubes for VLSI: Interconnect and Transistor Application'—2010, Proceeding of the IEEE, vol. 98, No. 12, pp. 2015-2031.

Sato et al., 'Growth of diameter-controlled carbon nanotubes using monodisperse nickel nanoparticles obtained with a differential mobility analyzer—2003, Chemical Phys. Lett. 382 (2003) 361-366.

Extended European Search Report for 17874089.0; dated Nov. 25, 2019; 9 pages.

Extended European Search Report for 17874052.8; dated Nov. 25, 2019; 9 pages.

* cited by examiner

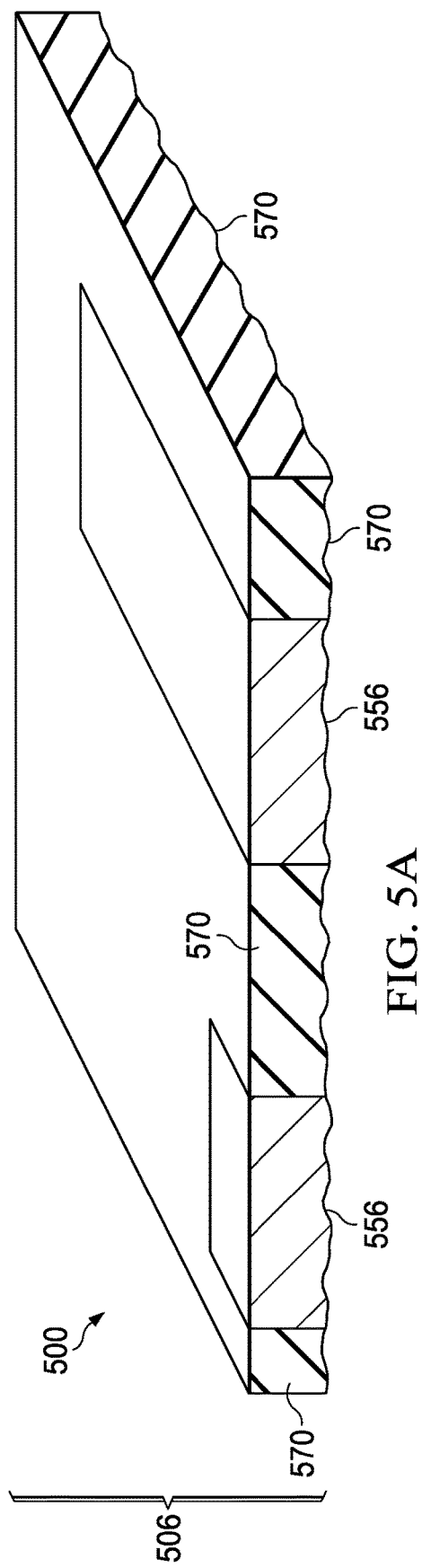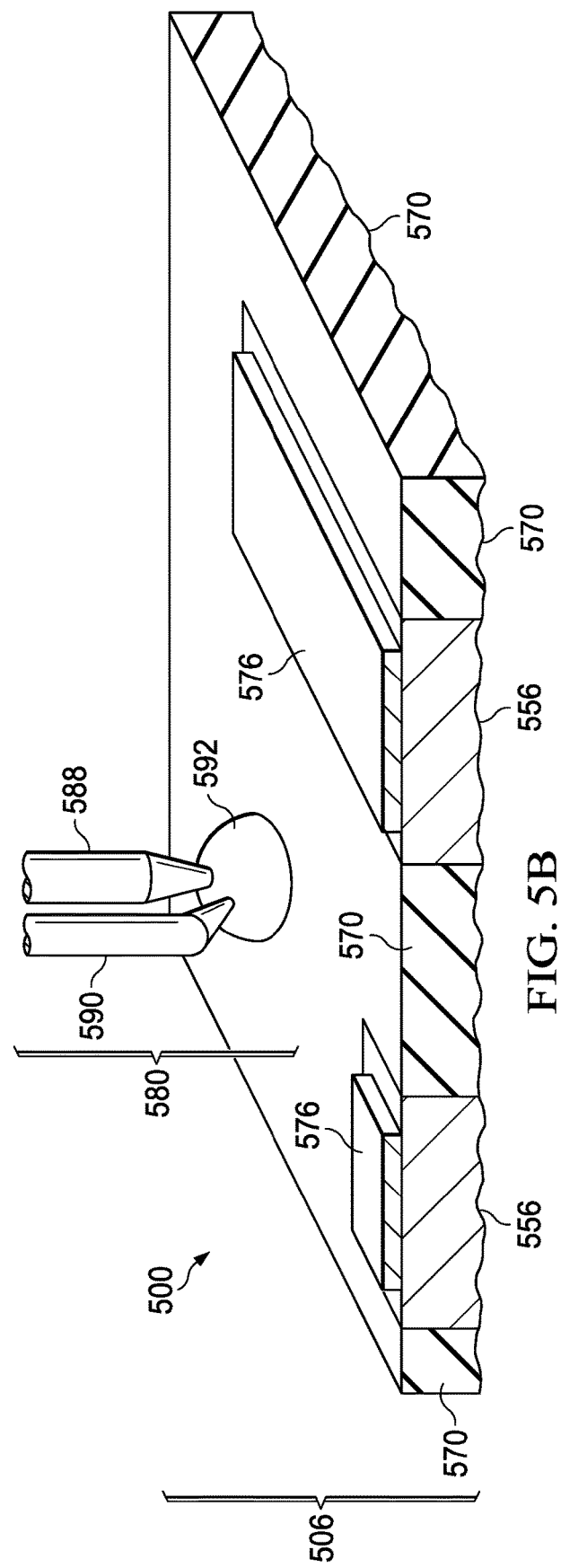

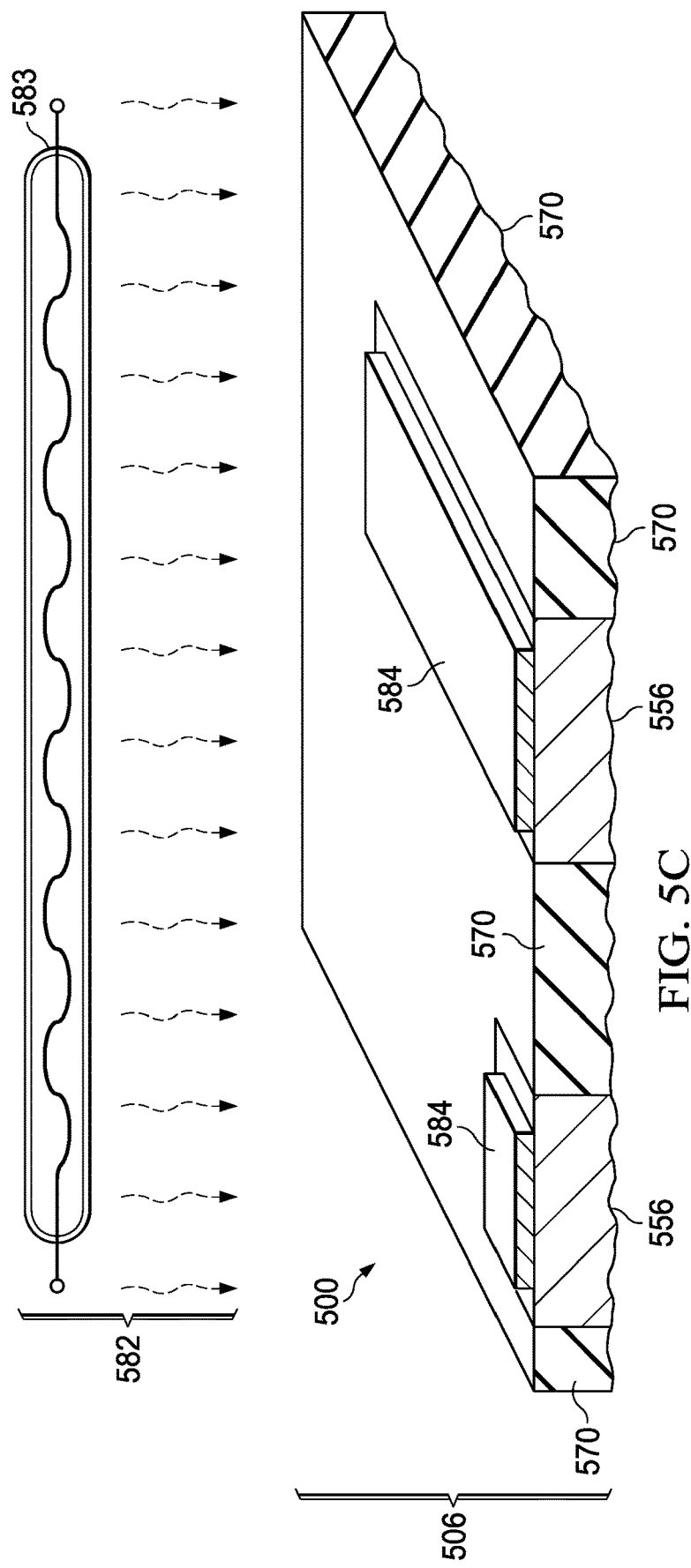

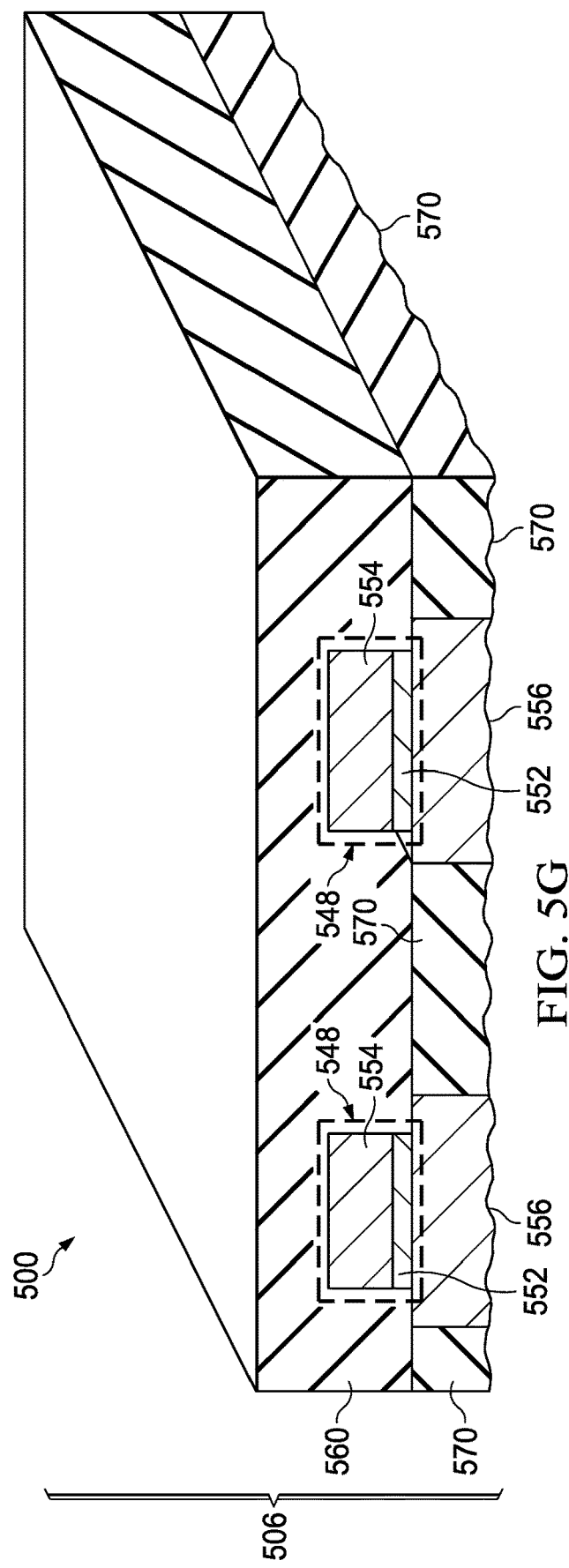

INTERCONNECT VIA WITH GROWN GRAPHITIC MATERIAL

FIELD OF THE INVENTION

The present disclosure relates to the field of integrated circuits. More particularly, the disclosure relates to thermal management in integrated circuits.

BACKGROUND OF THE INVENTION

Integrated circuits typically include vias in interconnect regions which vertically connect metal lines. During operation of the integrated circuit, high current levels are sometimes produced which degrade reliability of the vias, for example, by electromigration and/or ohmic heating processes. Tungsten vias often have voids which reduce reliability. Copper vias are susceptible to stress migration, leading to reduced reliability. Producing reliable vias while maintaining desired fabrication costs has been problematic.

SUMMARY OF THE INVENTION

The following presents a simplified summary in order to provide a basic understanding of one or more aspects of the current disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A method of forming an integrated circuit includes forming first and second dielectric layers over a semiconductor substrate. A first metal interconnect line is formed within a first dielectric layer located over the substrate, and a second metal interconnect line is formed within a second dielectric layer located over the substrate. A conductive via including a graphitic material is formed within a third dielectric layer between the first and second dielectric layers, the conductive via connecting the first and second metal interconnect lines. A nanoparticle film is located between the graphitic material and the first metal interconnect line and between the graphitic material and the third dielectric layer.

DESCRIPTION OF THE VIEWS OF THE DRAWINGS

FIG. 5A through FIG. 5I depict a further example method of forming an integrated circuit with graphitic vias according to an embodiment of the invention.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent applications are related and hereby incorporated by reference: U.S. patent application Ser. No. 15/361,390, U.S. patent application Ser. No. 15/361,394, U.S. patent application Ser. No. 15/361,397, U.S. patent application Ser. No. 15/361,399, U.S. patent application Ser. No. 15/361,403, all filed simultaneously with this application. With their mention in this section, these patent applications are not admitted to be prior art with respect to the present invention.

Terms such as "top," "bottom," "front," "back," "over," "above," "under," "below," and such, may be used in this disclosure. These terms should not be construed as limiting the position or orientation of a structure or element, but should be used to provide spatial relationship between structures or elements.

For the purposes of this disclosure, the term "lateral" is understood to refer to a direction parallel to a plane of an instant top surface of the integrated circuit, and the term "vertical" is understood to refer to a direction perpendicular to the plane of the instant top surface of the integrated circuit.

For the purposes of this disclosure, the term "instant top surface" of an integrated circuit is understood to refer to the top surface of the integrated circuit which exists at the particular step being disclosed. The instant top surface may change from step to step in the formation of the integrated circuit.

Figure 1A:
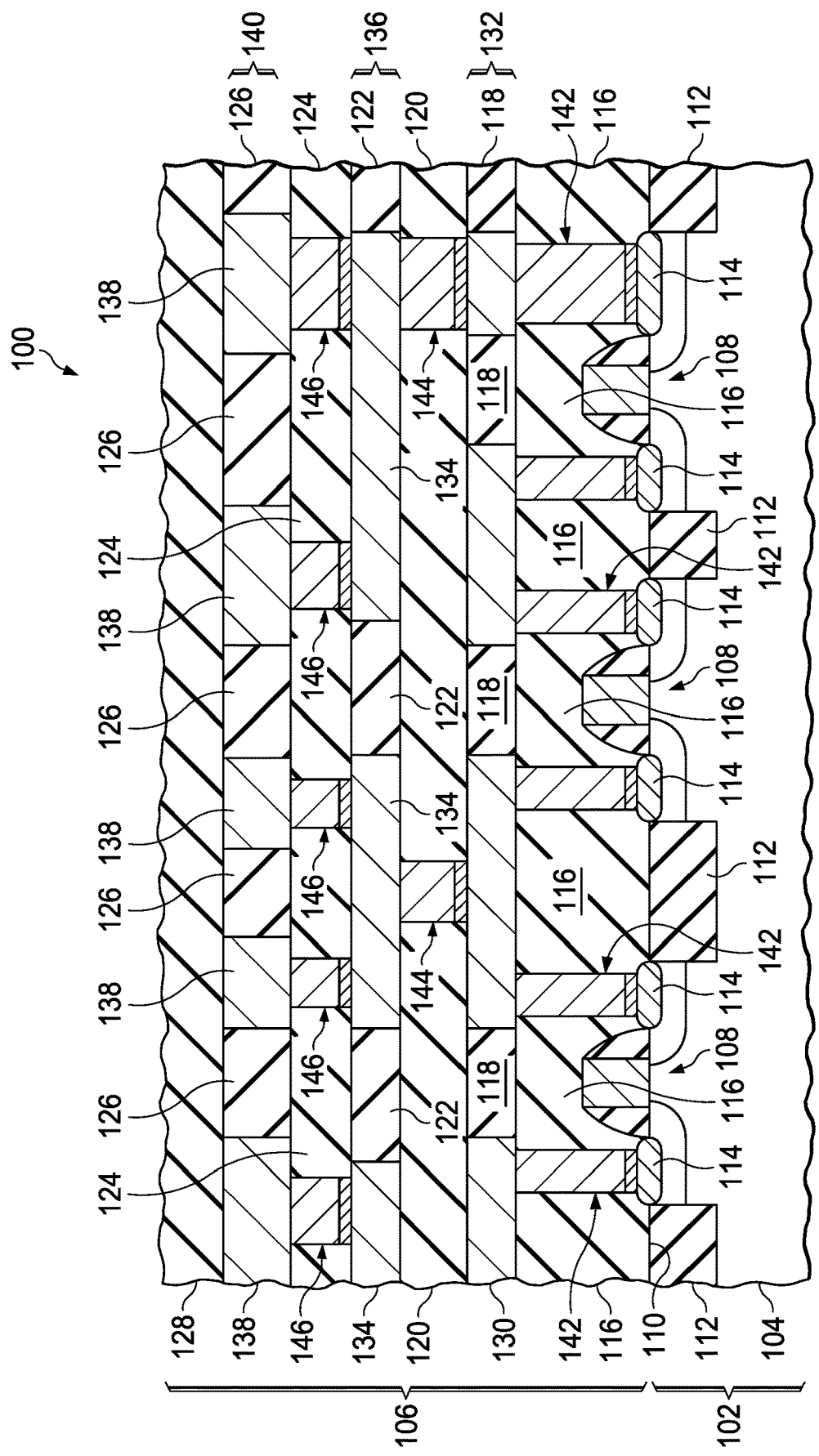
FIG. 1A and FIG. 1B are cross sections of an example integrated circuit containing graphitic vias according to an embodiment of the invention.
Figure 1B:
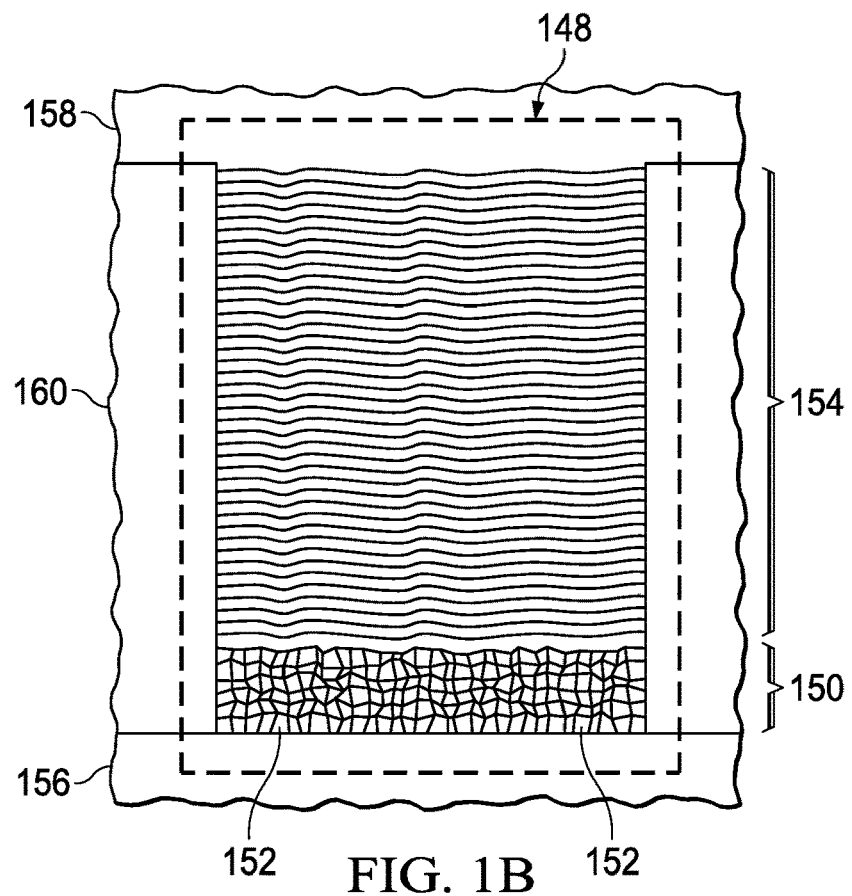

FIG. 1A and FIG. 1B are cross sections of an example integrated circuit containing graphitic vias according to an embodiment of the invention. Referring to FIG. 1A, the integrated circuit 100 includes a substrate 102 comprising a semiconductor material 104. The semiconductor material 104 may be a type IV semiconductor such as silicon, silicon germanium or silicon carbide. Other semiconductor materials are within the scope of the instant example. The integrated circuit 100 further includes an interconnect region 106 disposed above the substrate 102. Active components 108 of the integrated circuit 100, depicted in FIG. 1A as metal oxide semiconductor (MOS) transistors, are disposed in the integrated circuit 100. Other manifestations of the active components 108, such as bipolar junction transistors, junction field effect transistors (JFETs), and silicon controlled rectifiers (SCRs) are within the scope of the instant example. The active components 108 may be laterally separated by field oxide 112 disposed proximate to a boundary 110 between the substrate 102 and the interconnect region 106. The field oxide 112 may have, for example, a shallow trench isolation (STI) structure as depicted in FIG. 1A, or may have a localized oxidation of silicon (LOCOS) structure. Metal silicide 114 may be disposed on contact regions of the active components 108. The metal silicide 114 may include nickel silicide, cobalt silicide, titanium silicide, or the like.

The interconnect region 106 includes a plurality of dielectric layers, disposed in a dielectric layer stack. In the instant example, the plurality of dielectric layers includes a pre-metal dielectric (PMD) layer 116 disposed over the substrate 102. The PMD layer 116 may include, for example, a conformal liner of silicon nitride, a main layer of boron phosphorus silicate glass (BPSG) and a cap layer of silicon nitride or silicon carbide.

The plurality of dielectric layers of the instant example further includes a first intra-metal dielectric (IMD) layer 118 disposed over the PMD layer 116. The first IMD layer 118 may include, for example, an etch stop layer of silicon nitride, silicon oxynitride, or silicon carbide, a main layer of silicon dioxide or BPSG, and a cap layer of silicon nitride or silicon carbide.

The plurality of dielectric layers of the instant example further includes a first inter-level dielectric (ILD) layer 120 disposed over the first IMD layer 118. The first ILD layer 120 may include, for example, an etch stop layer, a main layer of low-k dielectric material such as organo-silicate glass (OSG), and a cap layer of silicon nitride and/or silicon carbide.

The plurality of dielectric layers of the instant example further includes a second IMD layer 122 disposed over the first ILD layer 120, a second ILD layer 124 disposed over the second IMD layer 122, a third IMD layer 126 disposed over the second ILD layer 124, and a third ILD layer 128 disposed over the third IMD layer 126.

The interconnect region 106 of the instant example includes a plurality of first interconnects 130 in a first interconnect level 132. The first interconnects 130 are disposed between the PMD layer 116 and the first ILD layer 120, and are laterally surrounded by the first IMD layer 118. The first interconnects 130 may include aluminum interconnects, damascene copper interconnects, and/or plated copper interconnects. An aluminum interconnect may include an aluminum layer with a few percent silicon, titanium, and/or copper, possibly on an adhesion layer comprising titanium, and possibly with an anti-reflection layer of titanium nitride on the aluminum layer. A damascene copper interconnect may include copper on a barrier layer of tantalum and/or tantalum nitride, disposed in a trench in the first IMD layer 118. A plated copper interconnect may include an adhesion layer at a bottom of the interconnect, and may have a barrier layer disposed on the sides of the interconnect.

The interconnect region 106 of the instant example includes a plurality of second interconnects 134 in a second interconnect level 136. The second interconnects 134 are disposed between the first ILD layer 120 and the second ILD layer 124, and are laterally surrounded by the second IMD layer 122. The second interconnects 134 may have include aluminum interconnects, damascene copper interconnects, and/or plated copper interconnects, and may have similar structures to the first interconnects 130. The interconnect region 106 of the instant example further includes a plurality of third interconnects 138 in a third interconnect level 140. The third interconnects 138 are disposed between the second ILD layer 124 and the third ILD layer 128, and are laterally surrounded by the third IMD layer 126. The third interconnects 138 may have include aluminum interconnects, dama-scene copper interconnects, and/or plated copper interconnects, and may have similar structures to the second interconnects 134.

The integrated circuit 100 includes graphitic vias in the interconnect region 106. Each graphitic via is electrically conductive. In the instant example, a plurality of first graphitic vias 142 is disposed in the PMD layer 116. The first graphitic vias 142 extend vertically from the metal silicide 114 to the first interconnects 130 and thus provide electrical connections between the first interconnects 130 and the active components 108. The first graphitic vias 142 may have a range of widths, as indicated in FIG. 1A. For example, one of the first graphitic vias 142 may have a width at least two times greater than a width of another of the first graphitic vias 142. Instances of the first graphitic vias 142 with greater widths provide lower electrical resistance between the corresponding metal silicide 114 and first interconnect 130, which may be advantageous for operation at higher currents. Instances of the first graphitic vias 142 with lesser widths enable the corresponding active component 108 to occupy a lower area, which may advantageously reduce fabrication cost of the integrated circuit 100. The width of each of the first graphitic vias 142 may be selected to attain a desired balance between electrical resistance and component area. Conventional tungsten contacts are typically limited to one width, due to difficulty of concurrently fabricating tungsten contacts with a range of widths.

Also in the instant example, a plurality of second graphitic vias 144 is disposed in the first ILD layer 120. The second graphitic vias 144 extend vertically from the first interconnects 130 to the second interconnects 134 and thus provide electrical connections between the first interconnects 130 and the second interconnects 134. The second graphitic vias 144 may have a range of widths, as indicated in FIG. 1A, accruing similar advantages as described for the range of widths of first graphitic vias 142. Conventional tungsten vias and conventional copper vias are typically limited to one width, due to difficulty of concurrently fabricating tungsten or copper vias with a range of widths.

Furthermore in the instant example, a plurality of third graphitic vias 146 is disposed in the second ILD layer 124. The third graphitic vias 146 extend vertically from the second interconnects 134 to the third interconnects 138 and thus provide electrical connections between the second interconnects 134 and the third interconnects 138. The third graphitic vias 146 may have a range of widths, as indicated in FIG. 1A, accruing similar advantages as described for the range of widths of first graphitic vias 142.

Each of the first graphitic vias 142, the second graphitic vias 144, and the third graphitic vias 146 has a structure which is exemplified in FIG. 1B. Referring to FIG. 1B, the graphitic via 148 may correspond to one of the first graphitic vias 142, one of the second graphitic vias 144, or one of the third graphitic vias 146. The graphitic via 148 includes a cohered nanoparticle film 150 which includes primarily nanoparticles 152. Adjacent nanoparticles 152 in the cohered nanoparticle film 150 cohere to each other. The cohered nanoparticle film 150 is substantially free of an organic binder material such as adhesive or polymer. The nanoparticles 152 include one or more metals suitable for catalyzing formation of graphitic material, for example, copper, nickel, palladium, platinum, iridium, rhodium, cerium, osmium, molybdenum, and/or gold. The graphitic via 148 also includes a layer of graphitic material 154 disposed on the cohered nanoparticle film 150. The graphitic material 154 may include, for example, graphite, graphitic carbon, graphene, and/or carbon nanotubes. The cohered nanoparticle film 150 is disposed on, and makes electrical contact to, a lower electrically conductive member 156. An upper electrically conductive member 158 is disposed on, and makes electrical contact to, the graphitic material 154. The graphitic via 148 is laterally surrounded by a dielectric layer 160. For the case wherein the graphitic via 148 corresponds to one of the first graphitic vias 142, the lower electrically conductive member 156 corresponds to the metal silicide 114, the upper electrically conductive member 158 corresponds to one of the first interconnects 130, and the dielectric layer 160 corresponds to the PMD layer 116. For the case wherein the graphitic via 148 corresponds to one of the second graphitic vias 144, the lower electrically conductive member 156 corresponds to one of the first interconnects 130, the upper electrically conductive member 158 corresponds to one of the second interconnects 134, and the dielectric layer 160 corresponds to the first ILD layer 120. For the case wherein the graphitic via 148 corresponds to one of the third graphitic vias 146, the lower electrically conductive member 156 corresponds to one of the second interconnects 134, the upper electrically conductive member 158 corresponds to one of the third interconnects 138, and the dielectric layer 160 corresponds to the second ILD layer 124. The graphitic vias 142, 144 and 146 may provide lower resistance and greater reliability than conventional contacts and vias.

Figure 2B:
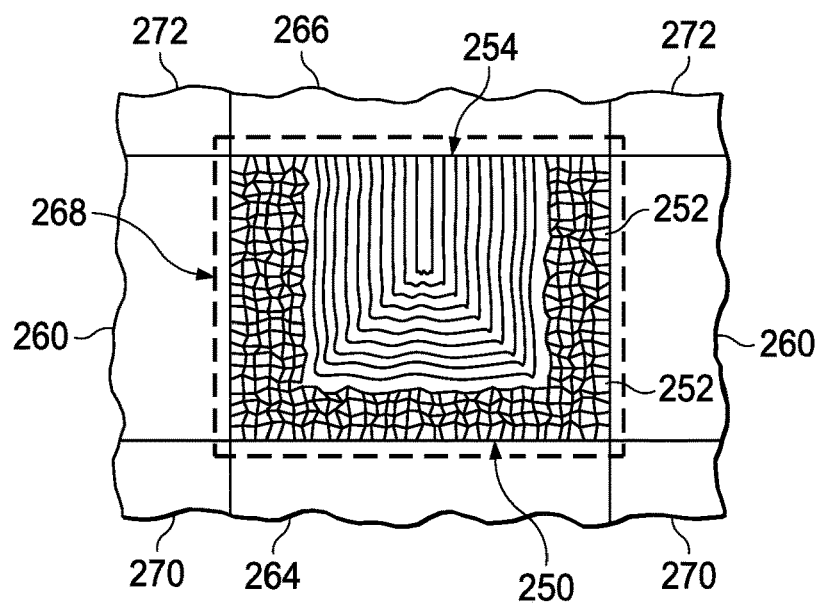
FIG. 2A and FIG. 2B are cross sections of another example integrated circuit containing a graphitic via according to an embodiment of the invention.
Figure 2A:
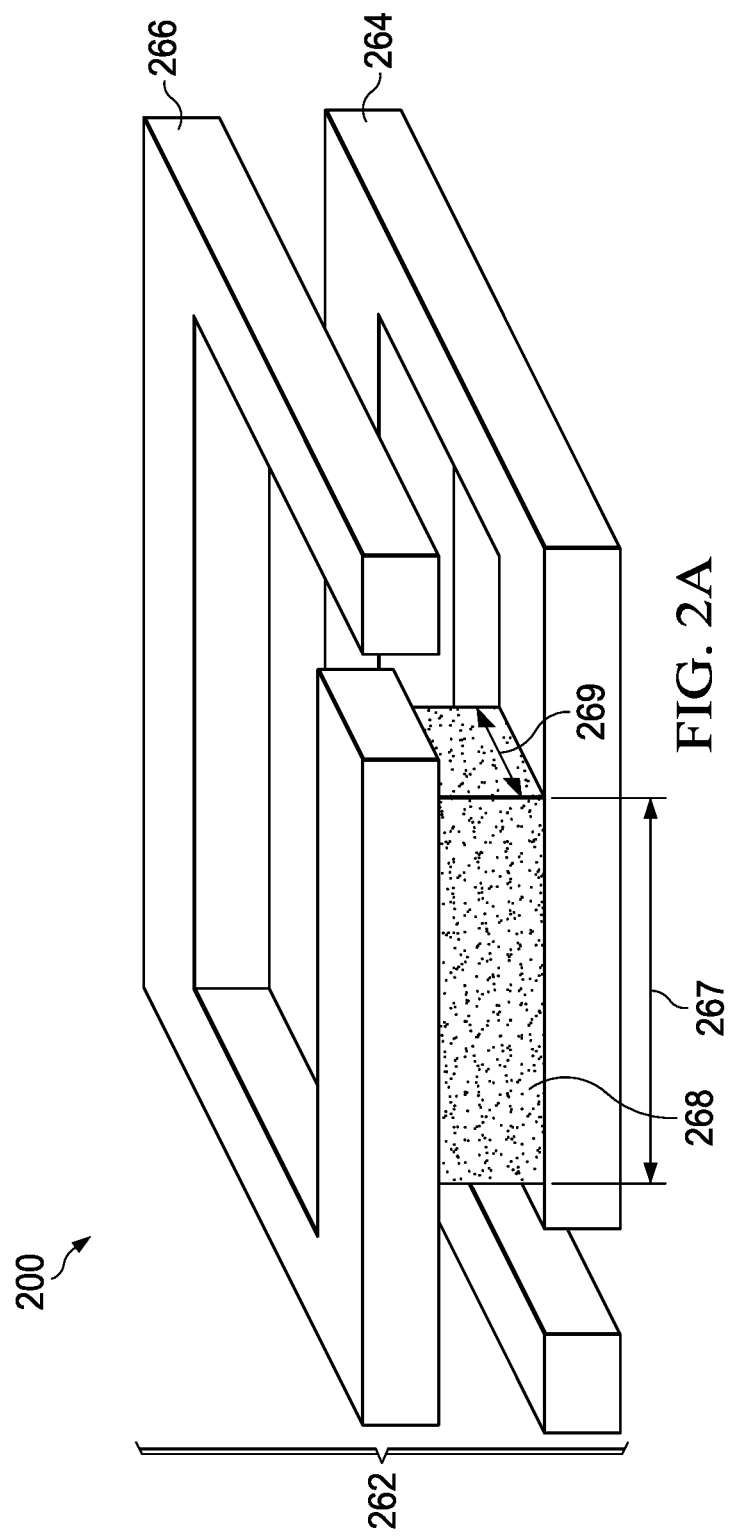

FIG. 2A and FIG. 2B are cross sections of another example integrated circuit containing a graphitic via according to an embodiment of the invention. Referring to FIG. 2A, the integrated circuit 200 includes a substrate, not shown, and active components, also not shown. The substrate and active components may be similar to those described in reference to FIG. 1A. In the instant example, the integrated circuit 200 includes an inductor 262 in an interconnect region disposed above the substrate. The inductor 262 includes a lower winding 264 and an upper winding 266, disposed above the lower winding 264, to attain a desired inductance. The lower winding 264 includes electrically conductive material, such as aluminum or copper. The lower winding 264 may be part of a lower interconnect level of the interconnect region. The lower winding 264 may be laterally surrounded by a lower IMD layer, not shown in FIG. 2A. The upper winding 266 includes electrically conductive material. The upper winding 266 may be part of an upper interconnect level of the interconnect region, and may be laterally surrounded by an upper IMD layer, not shown in FIG. 2A. The upper winding 266 is vertically separated from the lower winding 264, for example by an ILD layer, not shown in FIG. 2A. The lower IMD layer, the upper IMD layer, and the ILD layer may have compositions and structures as described in reference to FIG. 1A, for example. The inductor 262 may possibly be part of a transformer, or other electromagnetic component.

The inductor 262 further includes a graphitic via 268 which extends vertically from the lower winding 264 to the upper winding 266. The graphitic via 268 is electrically conductive and thus provides an electrical connection between the lower winding 264 and the upper winding 266. The graphitic via 268 may have a width comparable to a width of the lower winding 264 and/or a width of the upper winding 266, as depicted in FIG. 2A. The graphitic via 268 may have a length 267 at least two times greater than its width 269 as depicted in FIG. 2A, which may advantageously provide a desired low value of electrical resistance between the lower winding 264 and the upper winding 266. Conventional tungsten or copper vias typically cannot be fabricated with arbitrary lengths and widths, due to limited process latitude.

FIG. 2B is a cross section of the graphitic via 268. The graphitic via 268 includes a cohered nanoparticle film 250 which extends along a bottom and up sides of the graphitic via 268. The cohered nanoparticle film 250 includes primarily nanoparticles 252. Adjacent nanoparticles 252 cohere to each other. The nanoparticles 252 include one or more metals appropriate for catalysis of graphitic material, for example as described in reference to FIG. 1B. The cohered nanoparticle film 250 is substantially free of an organic binder material.

The graphitic via 268 also includes a layer of graphitic material 254 disposed on the cohered nanoparticle film 250. The graphitic material 254 may include one or more of the example materials disclosed in reference to FIG. 1B. The cohered nanoparticle film 250 is disposed on, and makes electrical contact to, the lower winding 264. The upper winding 266 is disposed on, and makes electrical contact to, the graphitic material 254, and possibly the cohered nanoparticle film 250 as indicated in FIG. 2B. The graphitic via 268 is laterally surrounded by a first dielectric layer 260, for example the ILD layer discussed in reference to FIG. 2A. The lower winding 264 is laterally surrounded by a second dielectric layer 270, which may be the lower IMD layer discussed in reference to FIG. 2A. The upper winding 266 is laterally surrounded by a third dielectric layer 272, which may be the upper IMD layer discussed in reference to FIG. 2A.

Figure 3A:
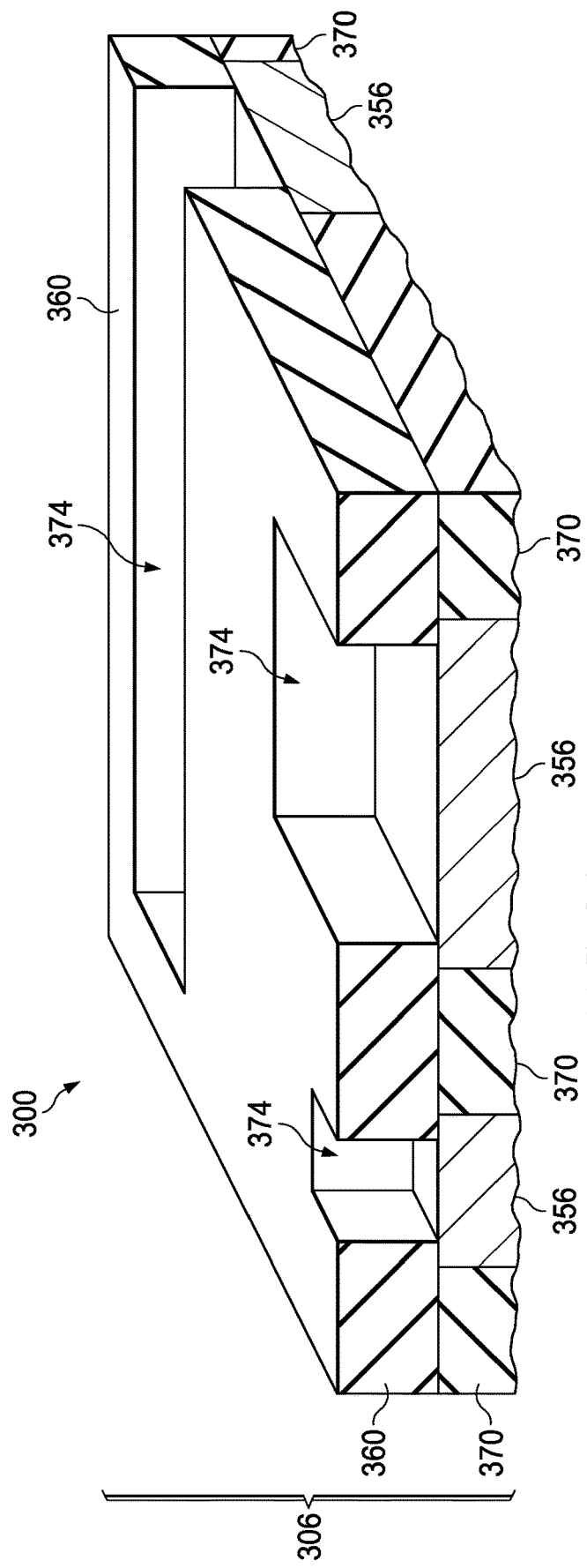
FIG. 3A through FIG. 3E depict an example method of forming an integrated circuit with graphitic vias according to an embodiment of the invention.

FIG. 3A through FIG. 3E depict an example method of forming an integrated circuit with graphitic vias according to an embodiment of the invention. Referring to FIG. 3A, the integrated circuit 300 includes a substrate and active components, not shown in FIG. 3A. The substrate and active components may be similar to those disclosed in reference to FIG. 1A. The integrated circuit 300 includes an interconnect region 306 formed over the substrate. The interconnect region 306 is shown in FIG. 3A through FIG. 3E in stages of partial completion. Lower conductive members 356 are formed as part of the integrated circuit 300. The lower conductive members 356 may be, for example, nodes of the active components, metal silicide local interconnects on the substrate, or interconnects in the interconnect region. The lower conductive members 356 are laterally surrounded by a first dielectric layer 370. The first dielectric layer 370 may be, for example, field oxide or an IMD layer.

A second dielectric layer 360 is formed over the lower conductive members 356 and the first dielectric layer 370. The second dielectric layer 360 may include a plurality of sub-layers, for example, an etch stop layer, a main layer and a cap layer. Each sub-layer of the second dielectric layer 360 may be formed, for example, by a chemical vapor deposition (CVD) process, atmospheric pressure chemical vapor deposition (APCVD) process, a low pressure chemical vapor deposition (LPCVD) process, or a plasma enhanced chemical vapor deposition (PECVD) process. The second dielectric layer 360 may be, for example, a PMD layer or an ILD layer.

Via holes 374 are formed through the second dielectric layer 360 in areas for the graphitic vias. The lower conductive members 356 are partly exposed by the via holes 374, as depicted in FIG. 3A. The via holes 374 may be formed by forming a mask over the second dielectric layer 360 which exposes areas for the via holes, and subsequently removing dielectric material from the second dielectric layer 360 by an etch process, such as a reactive ion etch (RIE) process. The mask may be subsequently removed.

Figure 3B:
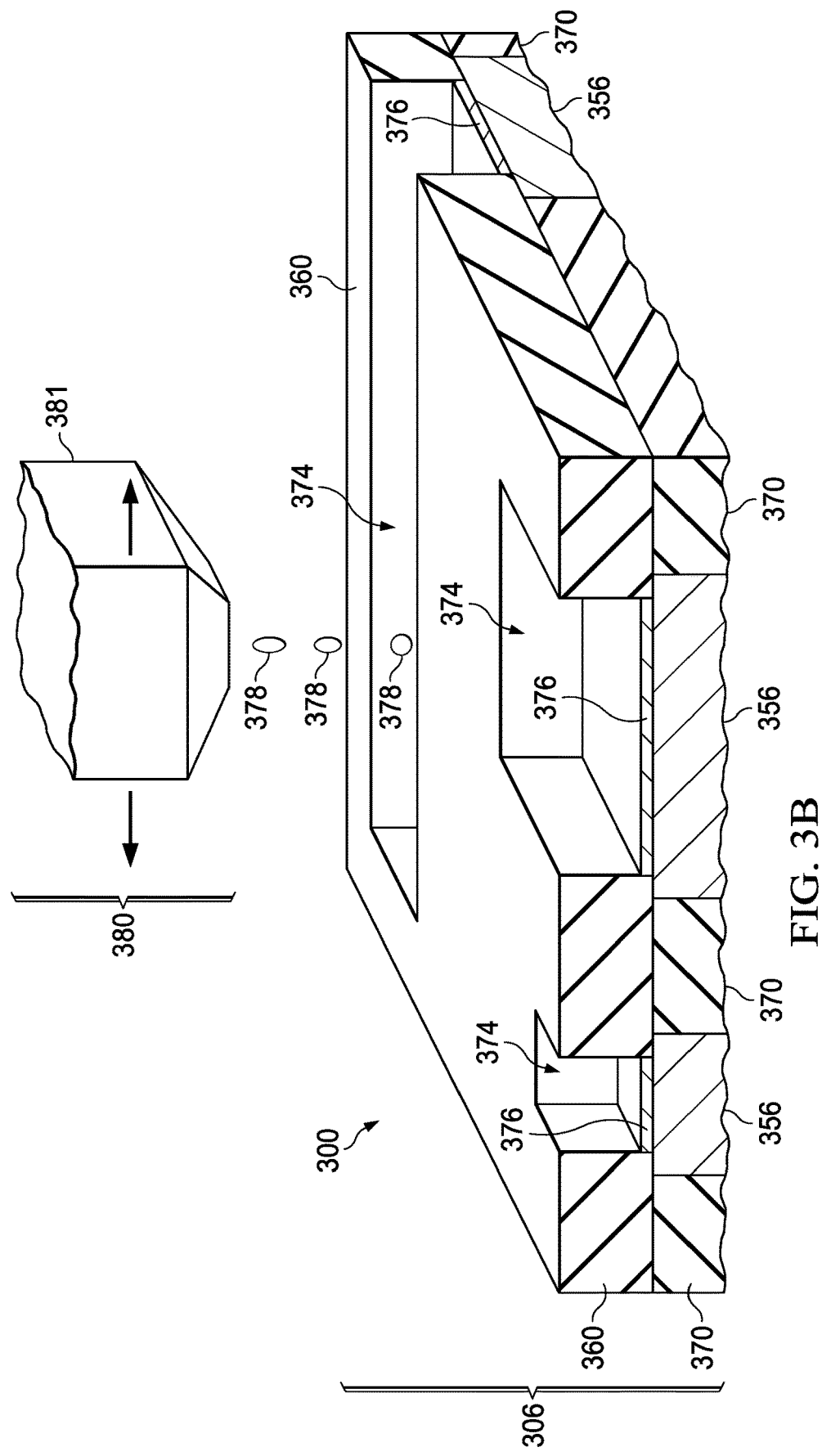

Referring to FIG. 3B, nanoparticle ink films 376 are formed by dispensing a nanoparticle ink 378 by an additive process 380 into the via holes 374. For the purposes of this disclosure, an additive process may be understood to dispose the nanoparticles in a desired area and not dispose the nanoparticles outside of the desired area, so that it is not necessary to remove a portion of the dispensed nanoparticles to produce a final desired configuration of the nanoparticles. Additive processes may enable forming films in desired areas without photolithographic processes and subsequent etch processes, thus advantageously reducing fabrication cost and complexity. The additive process 380 may use a discrete droplet dispensing apparatus 381, as indicated in FIG. 3B, such as an ink jet apparatus. Other manifestations of the additive process 380, such as a continuous extrusion process, a direct laser transfer process, an electrostatic deposition process, or an electrochemical deposition process, are within the scope of the instant example. The nanoparticle ink films 376 are disposed at bottoms of the via holes 374 as depicted in FIG. 3B, contacting the lower conductive members 356. The nanoparticle ink 378 includes the nanoparticles and a carrier fluid. The nanoparticle ink 378 may be, for example, an ink, a slurry, or a sol gel. The nanoparticles include metals appropriate for subsequent catalysis of graphitic material, for example the metals described in reference to FIG. 1B. There may be inorganic functional molecules, for example silane-based molecules which include silicon and oxygen, on surfaces of the nanoparticles. The nanoparticle ink 378 is dispensed into the via holes 374, and is not dispensed over a top surface of the second dielectric layer 360. The integrated circuit 300 and the dispensing apparatus 381 may be configured to move laterally with respect to each other to provide a desired dispensing pattern for the nanoparticle ink films 376.

Figure 3C:
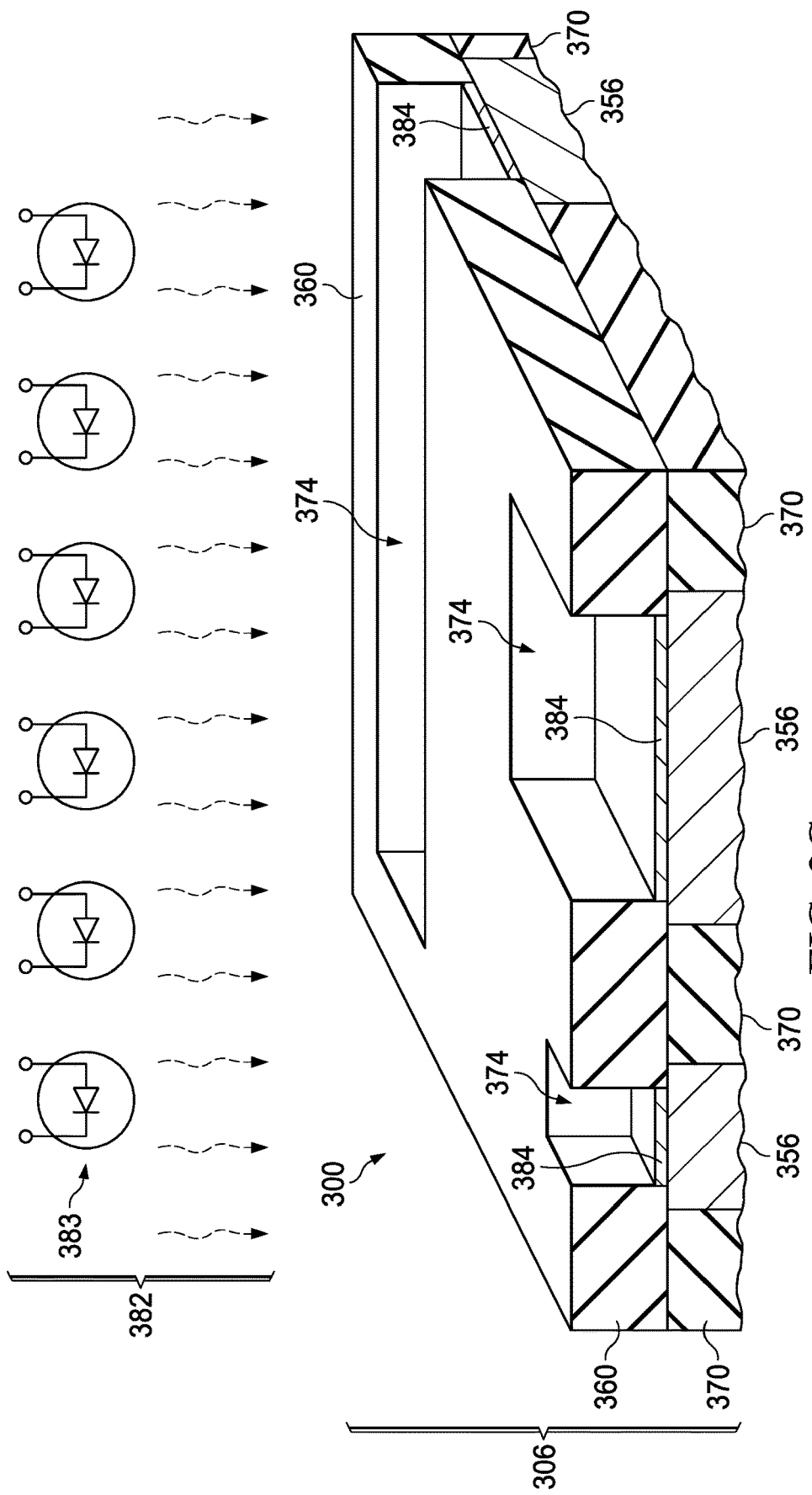

Referring to FIG. 3C, the nanoparticle ink films 376 of FIG. 3B are heated by a bake process 382 to remove at least a portion of a volatile material from the nanoparticle ink films 376 to form a nanoparticle film 384 which includes primarily nanoparticles. The bake process 382 may be a radiant heat process using, for example infrared light emitting diodes (IR LEDs) 383, as indicated schematically in FIG. 3C. Using IR LEDs 383 in a scanned system may enable applying the radiant heat to substantially heat only the nanoparticle ink films 376 while not applying the radiant heat to areas of the integrated circuit 300 outside of the nanoparticle ink films 376, advantageously reducing a heat load on the components of the integrated circuit 300. Alternatively, the bake process 382 may use another radiant heat source such as an incandescent lamp, or may be a hot plate process which heats the nanoparticle ink films 376 through the substrate of the integrated circuit 300. The bake process 382 may be performed in a partial vacuum, or in an ambient with a continuous flow of gas at low pressure, to enhance removal of the volatile material.

Figure 3D:
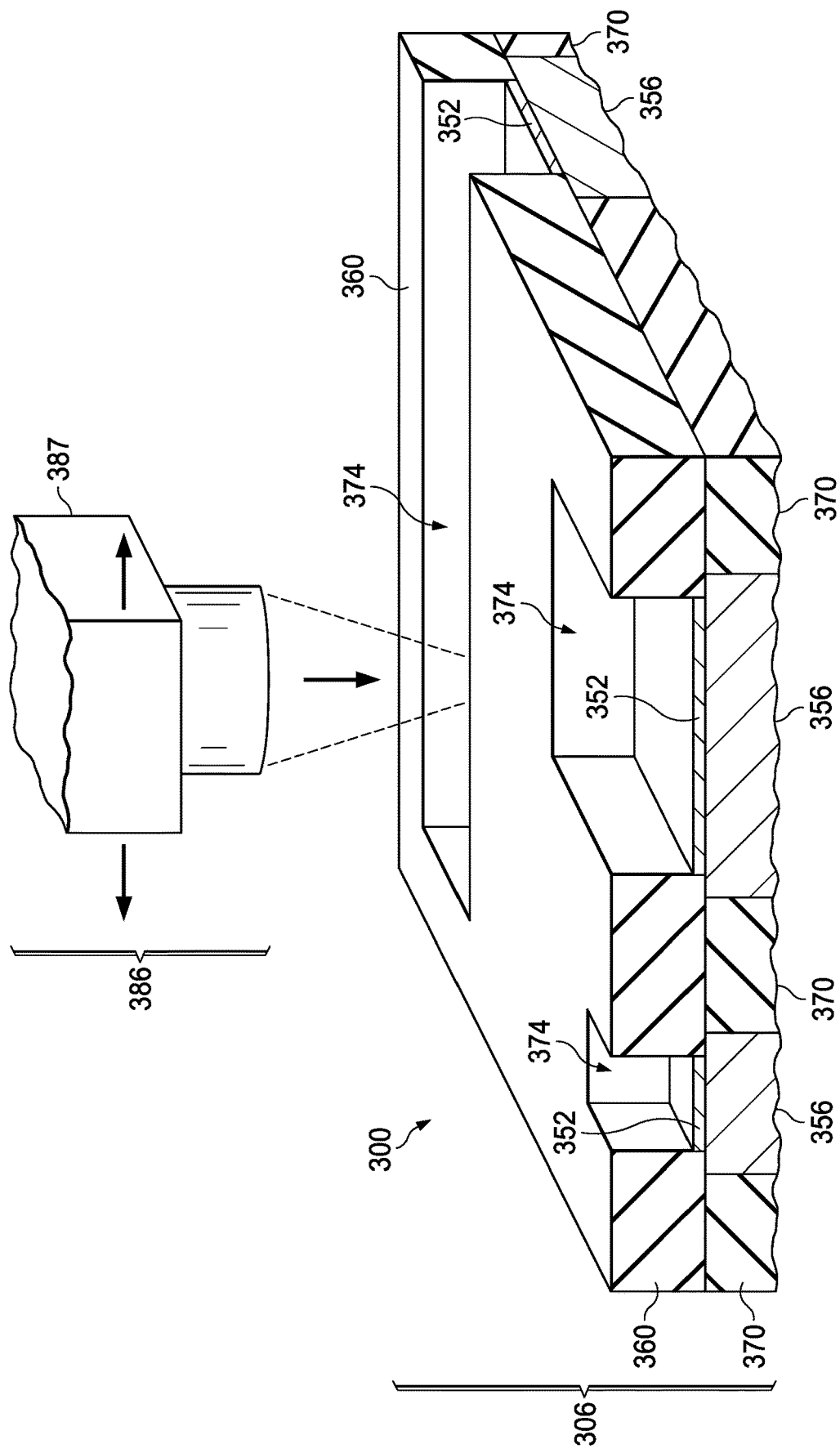

Referring to FIG. 3D, the nanoparticle film 384 of FIG. 3C is heated by a first cohesion inducing process 386 so that adjacent nanoparticles cohere to each other, to form a cohered nanoparticle film 352 in the via holes 374. The temperature required for the nanoparticles to cohere to each other is a function of the size of the nanoparticles. Smaller nanoparticles may be heated at lower temperatures than larger nanoparticles to attain a desired cohesion of the nanoparticles. The nanoparticles may be selected to enable cohesion at a temperature compatible with the integrated circuit components and structures. Cohesion may occur by a process that includes a physical mechanism involving diffusion of atoms between the adjacent nanoparticles. Cohesion may also occur by a process that includes a chemical mechanism involving reaction of atoms and/or molecules between the adjacent nanoparticles. The first cohesion inducing process 386 may include a scanned laser heating process, which provides radiant energy from a scanned laser apparatus 387 as depicted in FIG. 3D. The scanned laser apparatus 387 may be configured to apply heat to the nanoparticle film 384 and avoid applying heat to areas outside the nanoparticle film 384, thus advantageously reducing a heat load on the integrated circuit 300. In one alternative to the spike anneal process, the nanoparticle film 384 may be annealed by a spike anneal process, which provides radiant energy from an incandescent light source, for a time period of 100 milliseconds to 5 seconds, across the existing top surface of the integrated circuit 300. In another alternative to the spike anneal process, the nanoparticle film 384 may be annealed by a flash anneal process, which provides radiant energy, commonly from a laser or flashlamp, for a time period of 1 microsecond to 10 microseconds, across the existing top surface of the integrated circuit 300. The cohered nanoparticle film 352 is electrically conductive.

Figure 3E:
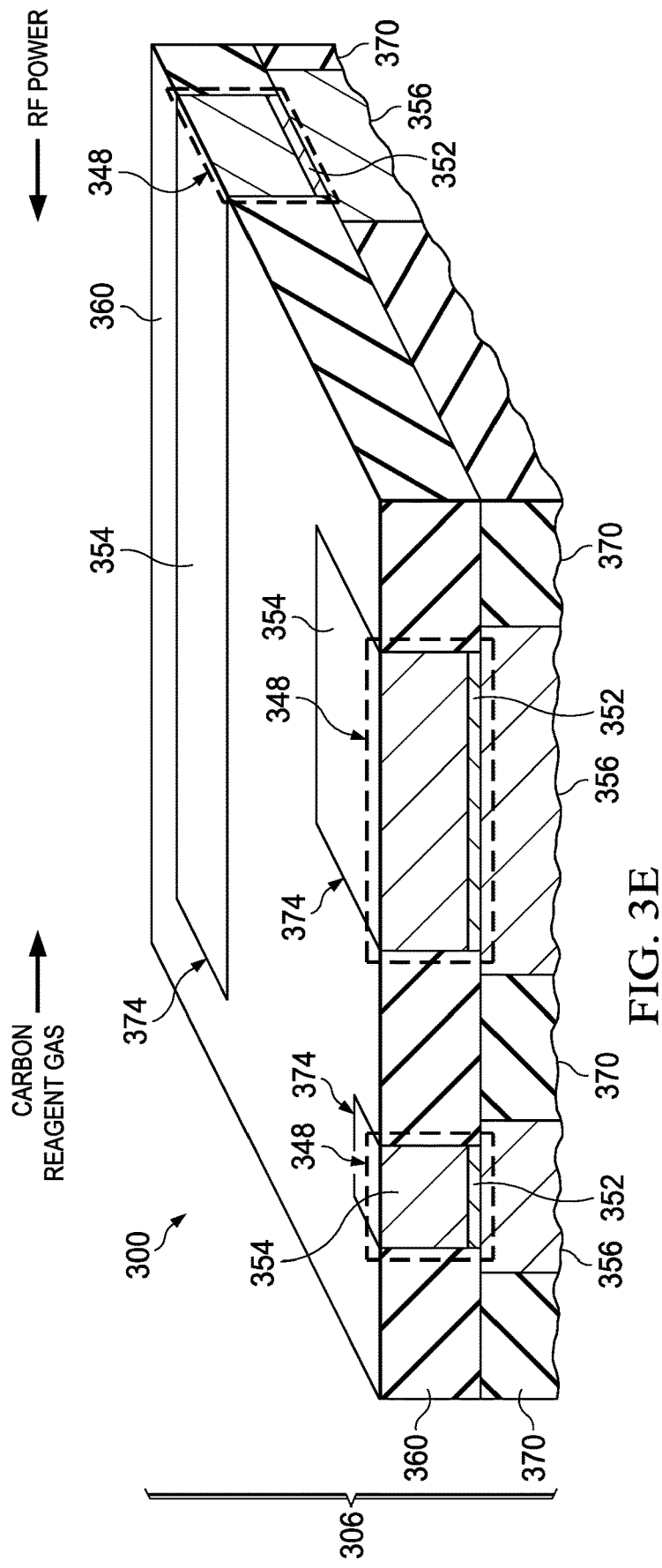

Referring to FIG. 3E, a graphitic material 354 is selectively formed in the via holes 374 on the cohered nanoparticle film 352 by a graphitic material PECVD process. In the graphitic material PECVD process, the integrated circuit 300 is heated, for example to a temperature of 200° C. to 400° C. A carbon-containing reagent gas, denoted in FIG. 3E as "CARBON REAGENT GAS" is flowed over the integrated circuit 300. The carbon-containing reagent gas may include, for example, methane, straight chain alkanes such as ethane, propane and/or butane, alcohols such as ethanol, and/or cyclic hydrocarbons such as cyclobutane or benzene. Radio frequency (RF) power, denoted in FIG. 3E as "RF POWER" is applied to the carbon-containing reagent gas to generate carbon radicals above the integrated circuit 300. The metal in the cohered nanoparticle film 352 catalyzes the carbon radicals to react to form a first layer of the graphitic material 354 selectively on the cohered nanoparticle film 352. Subsequent layers of the graphitic material 354 are formed selectively on the previously formed layers of graphitic material 354, so that the graphitic material 354 is formed in the via holes 374, and graphitic material is not formed elsewhere on the integrated circuit 300. The graphitic material 354 is electrically conductive. A combination of the cohered nanoparticle film 352 and the graphitic material 354 provide the graphitic vias 348. Fabrication of the integrated circuit 300 is continued with forming upper conductors, not shown, over the graphitic vias 348, so that the graphitic vias 348 provide electrical connections between the upper conductors and the lower conductive members 356.

Figure 4A:
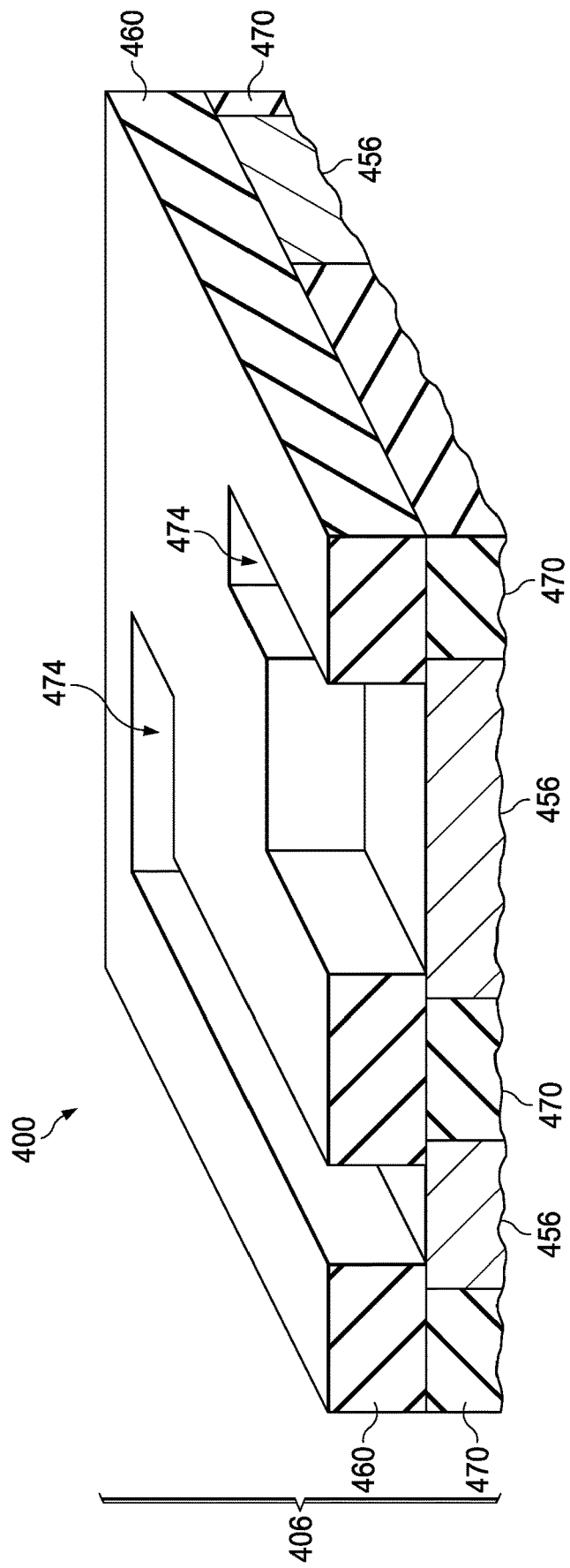
FIG. 4A through FIG. 4D depict another example method of forming an integrated circuit with graphitic vias according to an embodiment of the invention.

FIG. 4A through FIG. 4D depict another example method of forming an integrated circuit with graphitic vias according to an embodiment of the invention. Referring to FIG. 4A, the integrated circuit 400 includes a substrate and active components, not shown in FIG. 4A. The substrate and active components may be similar to those disclosed in reference to FIG. 1A. The integrated circuit 400 includes an interconnect region 406 formed over the substrate. The interconnect region 406 is shown in FIG. 4A through FIG. 4D in stages of partial completion. Lower conductive members 456 are formed as part of the integrated circuit 400. The lower conductive members 456 are laterally surrounded by a first dielectric layer 470. A second dielectric layer 460 is formed over the lower conductive members 456 and the first dielectric layer 470. Via holes 474 are formed through the second dielectric layer 460 in areas for the graphitic vias. The lower conductive members 456 are partly exposed by the via holes 474, as depicted in FIG. 4A.

Figure 4B:
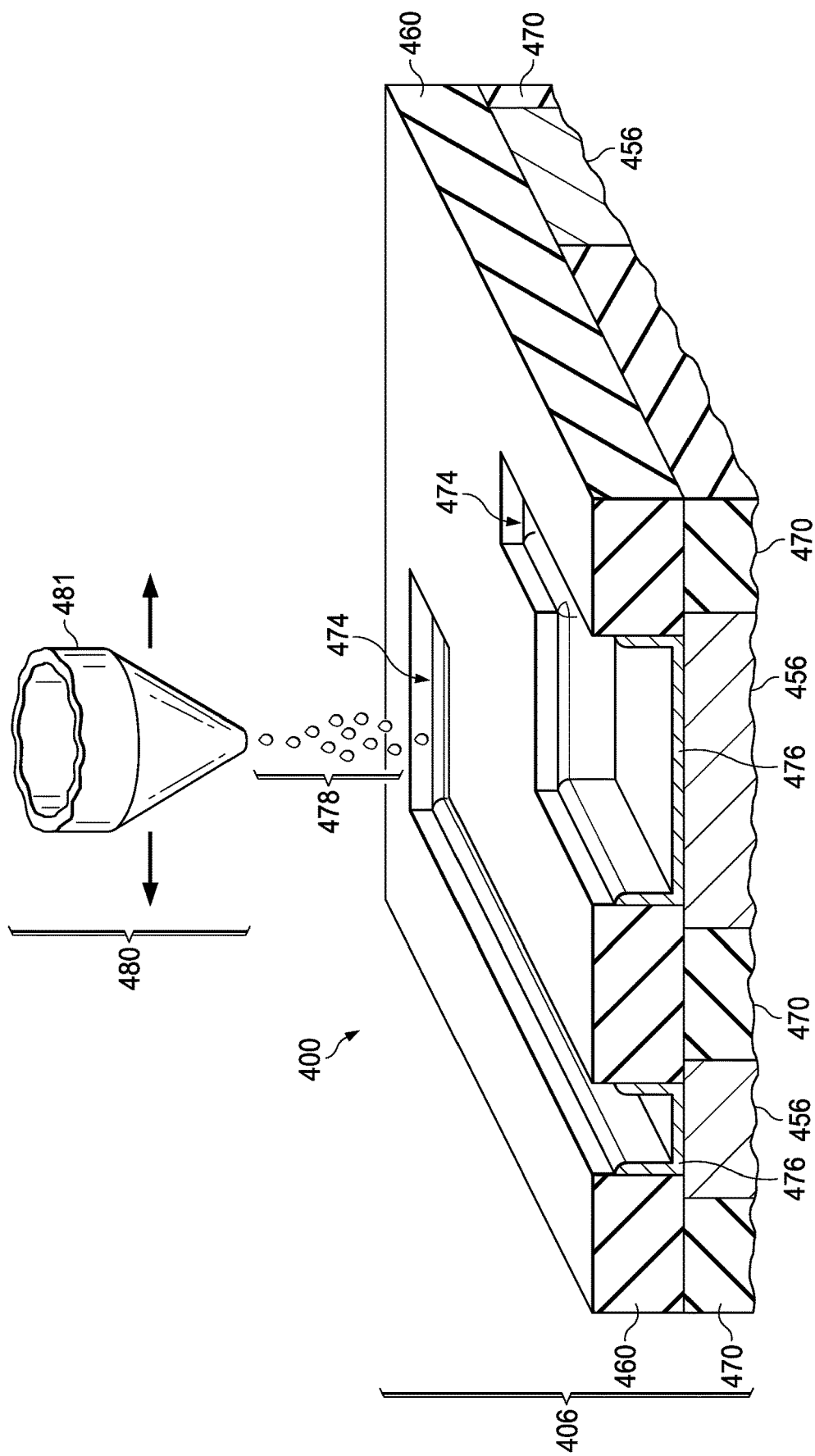

Referring to FIG. 4B, a nanoparticle ink 478 is dispensed into the via holes 474 by an additive process 480 to form a nanoparticle ink film 476 on bottoms and sides of the via holes 474, as depicted in FIG. 4B. The nanoparticle ink 478 includes nanoparticles which include one or more metals suitable for catalysis of graphitic material. The additive process 480 may use an electrostatic deposition apparatus 481 as depicted schematically in FIG. 4B. Other manifestations of the additive process 480 are within the scope of the instant example. The nanoparticle ink film 476 is substantially free of an organic binder material.

Figure 4C:
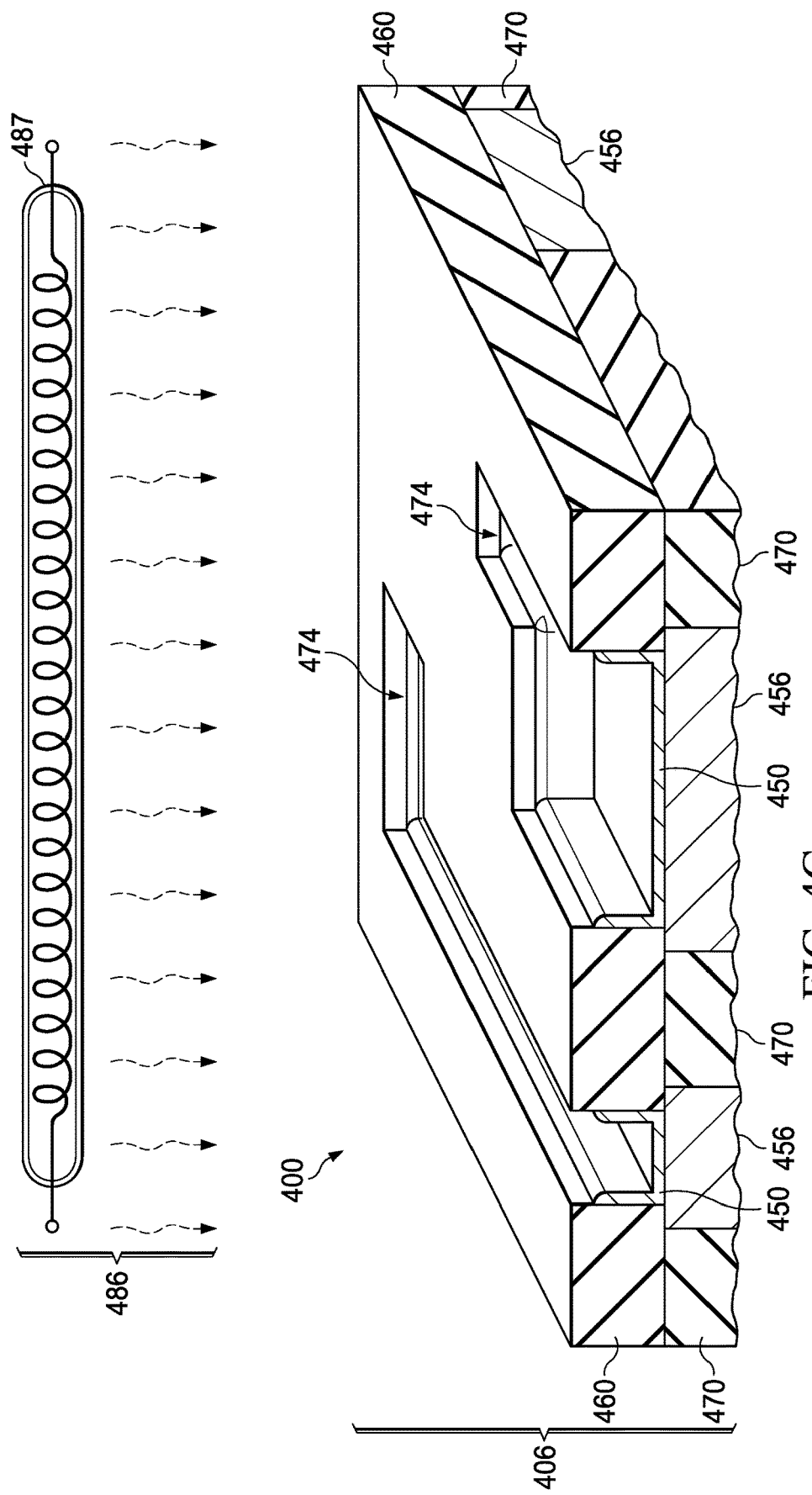

Referring to FIG. 4C, the nanoparticle ink film 476 of FIG. 4B is heated in two stages by a combination heating process 486. The first heating stage of the combination heating process 486 heats the nanoparticle ink film 476 to remove a volatile material, to form a nanoparticle film which include primarily nanoparticles. The second stage of the combination heating process 486 heats the nanoparticle film to induce cohesion between the nanoparticles, to form a cohered nanoparticle film 450. The combination heating process 486 may use an incandescent light source 487 as depicted schematically in FIG. 4C. Using the combination heating process 486 may advantageously reduce fabrication time and fabrication cost for the integrated circuit 400 compared to using separate heating processes. The cohered nanoparticle film 450 is electrically conductive.

Figure 4D:
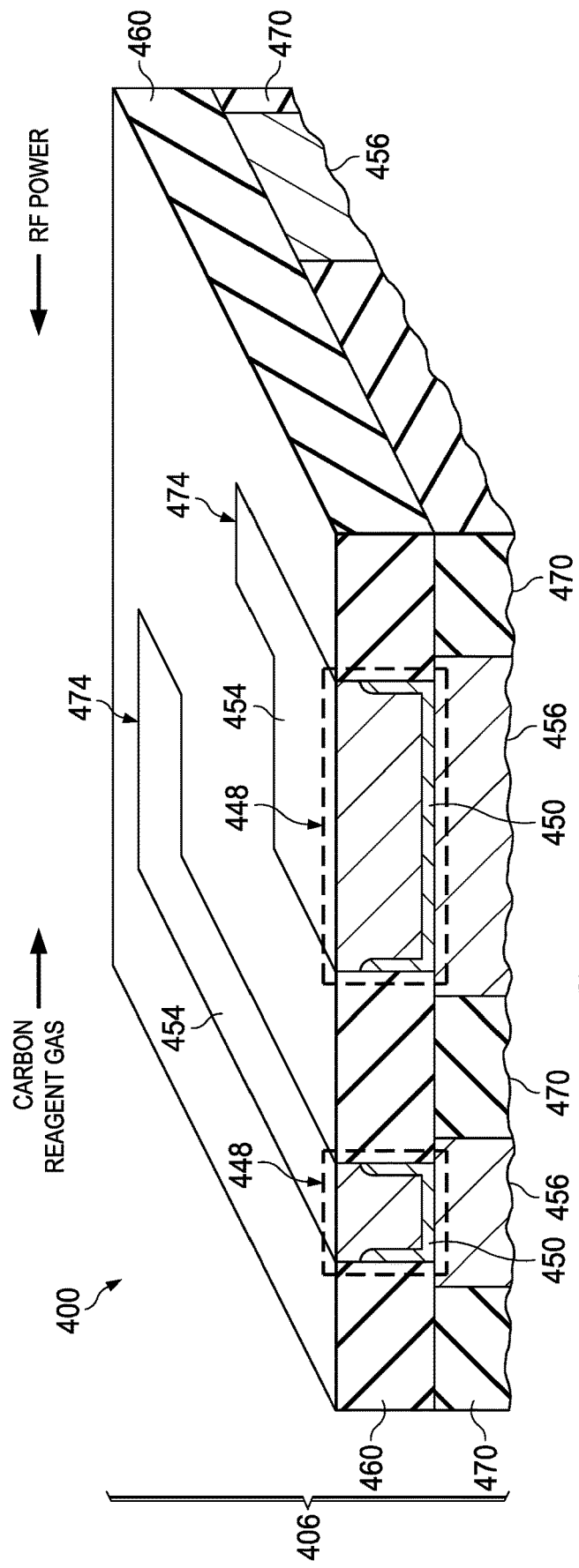

Referring to FIG. 4D, a graphitic material 454 is selectively formed in the via holes 474 on the cohered nanoparticle film 450 by a carbon PECVD process, for example as described in reference to FIG. 3E. In the carbon PECVD process, the integrated circuit 400 is heated. A carbon-containing reagent gas, denoted in FIG. 4D as "CARBON REAGENT GAS" is flowed over the integrated circuit 400 and RF power, denoted in FIG. 4D as "RF POWER" is applied to the carbon-containing reagent gas to generate carbon radicals above the integrated circuit 400. The metal in the nanoparticles of the cohered nanoparticle film 450 catalyzes the carbon radicals to react to form a first layer of the graphitic material 454 selectively on the cohered nanoparticle film 450. Subsequent layers of the graphitic material 454 are formed selectively on the previously formed layers of graphitic material 454, so that the graphitic material 454 is formed in the via holes 474, and graphitic material is not formed elsewhere on the integrated circuit 400. A combination of the cohered nanoparticle film 450 and the graphitic material 454 provide the graphitic vias 448. Fabrication of the integrated circuit 400 is continued with forming upper conductors, not shown, over the graphitic vias 448, so that the graphitic vias 448 provide electrical connections between the upper conductors and the lower conductive members 456.

Figure 5D:
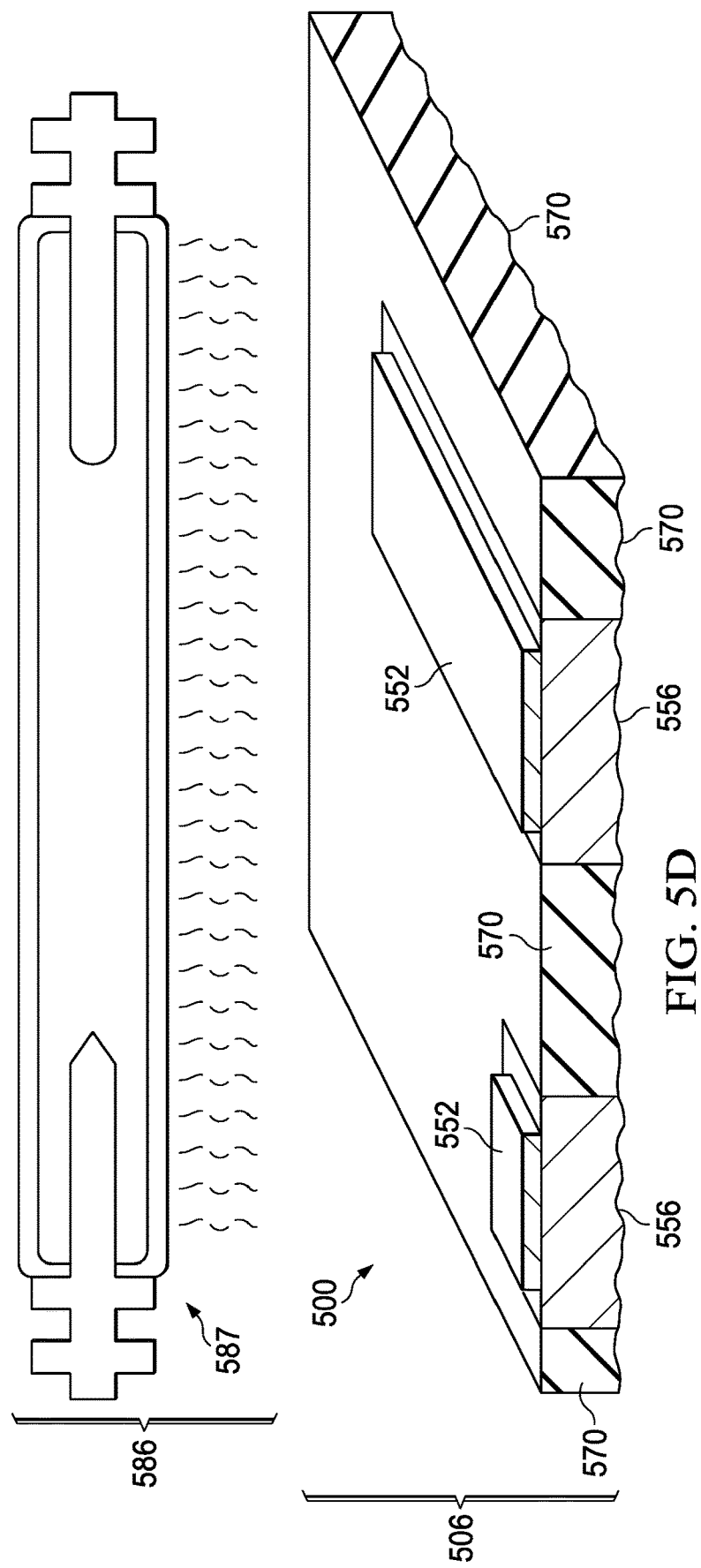

FIG. 5A through FIG. 5I depict a further example method of forming an integrated circuit with graphitic vias according to an embodiment of the invention. Referring to FIG. 5A, the integrated circuit 500 includes a substrate and active components, not shown in FIG. 5A. The integrated circuit 500 includes an interconnect region 506 formed over the substrate. The interconnect region 506 is shown in FIG. 5A through FIG. 5I in stages of partial completion. Lower conductive members 556 are formed as part of the integrated circuit 500. The lower conductive members 556 are laterally surrounded by a first dielectric layer 570.

Referring to FIG. 5B, nanoparticle ink films 576 are formed on the lower conductive members 556 by an additive process 580. The nanoparticle ink films 576 include nanoparticles which contain one or more metals appropriate for catalysis of graphitic material. The additive process 580 may be an electrochemical deposition process, as depicted in FIG. 5B, with a main electrode 588 which dispenses nanoparticle ink, and a counter electrode 590. The nanoparticle ink is electrically charged and transferred from the main electrode 588 through a dielectric fluid 592 to the integrated circuit 500 by applying a voltage differential between the main electrode 588 and the counter electrode 590. The nanoparticle ink films 576 may be laterally recessed from edges of the lower conductive members 556 as depicted in FIG. 5B, may be substantially coincident with the edges of the lower conductive members 556, or may extend onto the first dielectric layer 570, or any combination thereof. The additive process may alternatively be a discrete dispensing process, a continuous extrusion process, a direct laser transfer process, or an electrostatic deposition process.

Referring to FIG. 5C, the nanoparticle ink films 576 of FIG. 5B may be heated by a bake process 582 to remove a volatile material from the nanoparticle ink films 576, to form nanoparticle films 584. The nanoparticle films 584 include primarily nanoparticles. The bake process 582 may be a radiant heat process using an incandescent lamp 583 as indicated schematically in FIG. 5C. As an alternative, the bake process 582 may be a hot plate process.

Referring to FIG. 5D, adjacent nanoparticles in the nanoparticle films 584 of FIG. 5C are induced to cohere by a cohesion inducing process 586 to form cohered nanoparticle films 552. The cohesion inducing process 586 may induce the nanoparticles to cohere, for example, by heating the nanoparticle films 584 in a flash heating process using a flash lamp 587 as depicted schematically in FIG. 5D. Other methods of inducing nanoparticles to cohere are within the scope of the instant example. The cohered nanoparticle films 552 are electrically conductive.

Figure 5E:
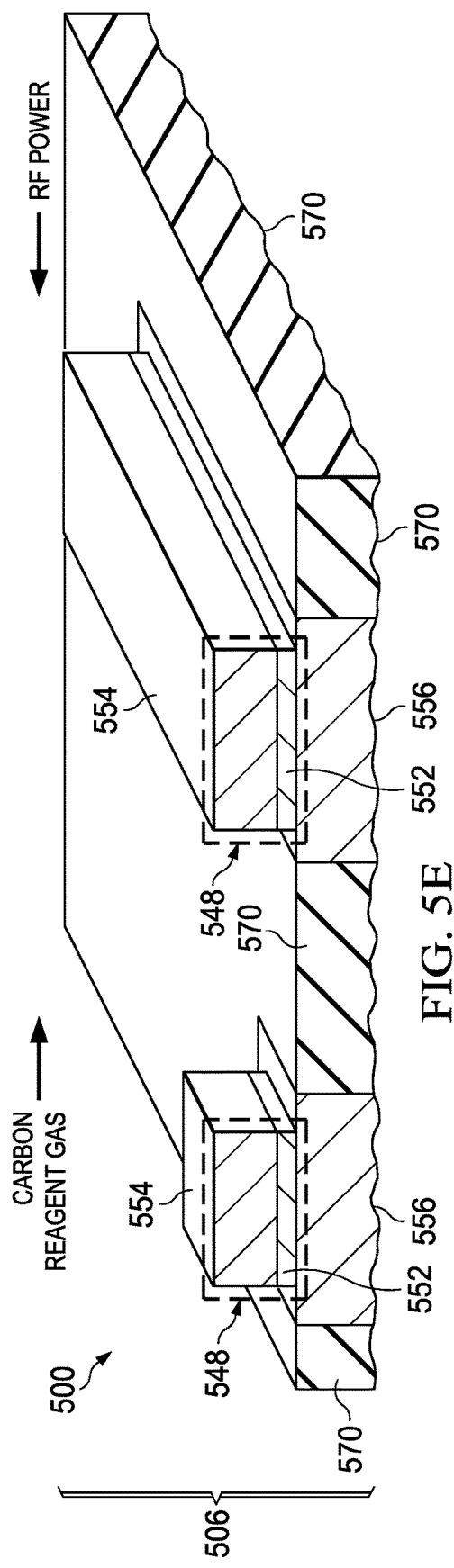

Referring to FIG. 5E, layers of graphitic material 554 are selectively formed on the cohered nanoparticle films 552 by a carbon PECVD process, for example as described in reference to FIG. 3E, by heating the integrated circuit 500, flowing a carbon-containing reagent gas, denoted in FIG. 5E as "CARBON REAGENT GAS" over the integrated circuit 500 and applying RF power, denoted in FIG. 5E as "RF POWER" to the carbon-containing reagent gas. The metal in the nanoparticles of the cohered nanoparticle film 552 catalyzes carbon radicals produced by the carbon-containing reagent gas under application of the RF power to react to form a first layer of the graphitic material 554 selectively on the cohered nanoparticle film 552. In the instant example, no substantial amount of the first layer of the graphitic material is formed on the integrated circuit 500 outside of the cohered nanoparticle film 552. Subsequent layers of the graphitic material 554 are formed selectively on the previously formed layers of graphitic material 554, so that the graphitic material 554 is formed on the cohered nanoparticle film 552, and graphitic material is not formed elsewhere on the integrated circuit 500. A combination of the cohered nanoparticle film 552 and the graphitic material 554 provide the graphitic vias 548.

Figure 5F:
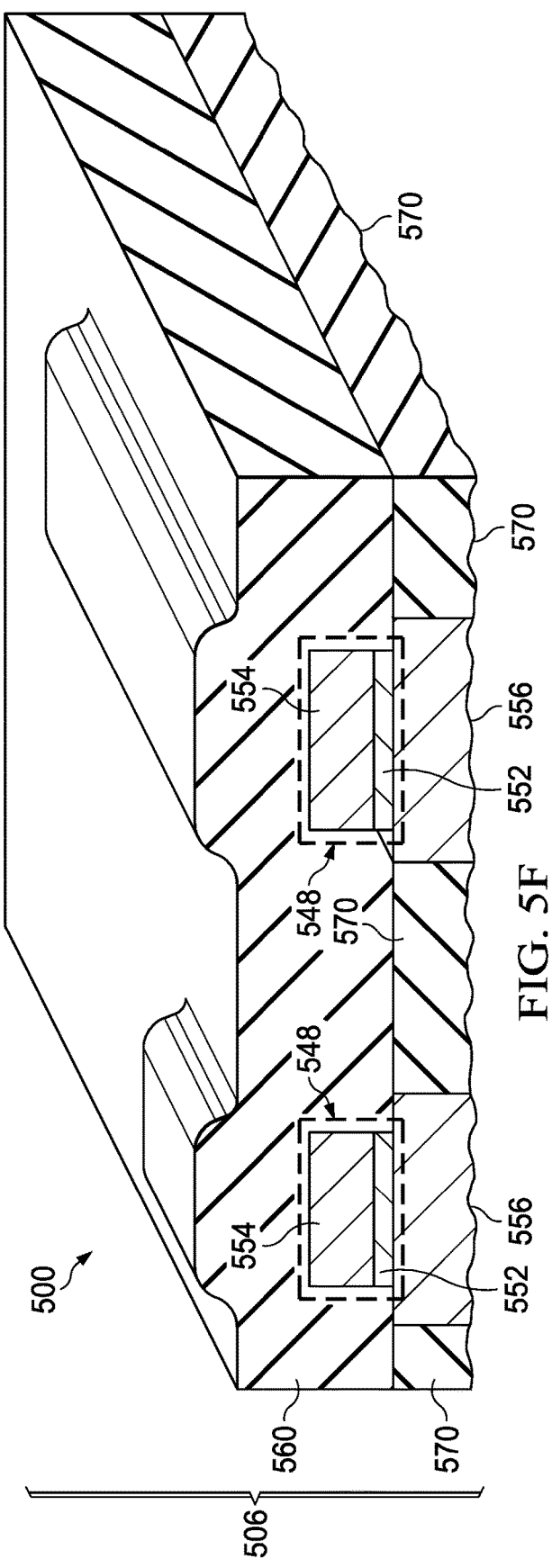

Referring to FIG. 5F, a second dielectric layer 560 is formed over the graphitic vias 548 and over the first dielectric layer 570. In the instant example, the second dielectric layer 560 has a thickness sufficient to form damascene interconnects above the graphitic vias 548. The second dielectric layer 560 may include a main layer of a silicon dioxide-based material formed by a PECVD process using tetraethyl orthosilicate (TEOS). The second dielectric layer 560 may also include an etch stop layer and/or a cap layer. Other compositions and layer structures of the second dielectric layer 560 are within the scope of the instant example. The second dielectric layer 560 may be at least partially conformal, so that a topography of a top surface of the second dielectric layer 560 corresponds to the graphitic vias 548, as depicted in FIG. 5F.

Referring to FIG. 5G, the second dielectric layer 560 may be planarized, for example by an oxide chemical mechanical polish (CMP) process or a resist etchback (REB) process. In the instant example, the planarized second dielectric layer 560 covers the graphitic vias 548 with sufficient dielectric material to form damascene interconnects above the graphitic vias 548.

Figure 5H:
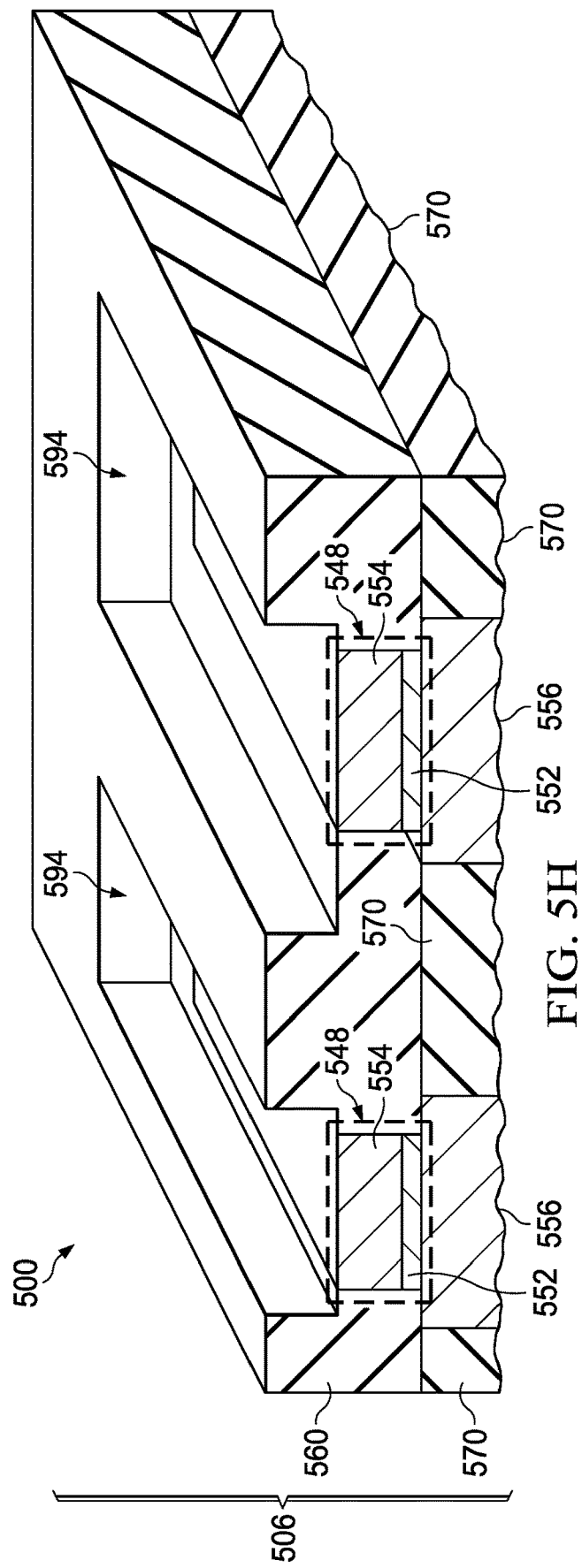

Referring to FIG. 5H, interconnect trenches 594 are formed in the second dielectric layer 560. One or more of the interconnect trenches 594 may expose one or more of the graphitic vias 548, as depicted in FIG. 5H. The interconnect trenches 594 may be formed, for example, by a timed etch process.

Figure 5I:
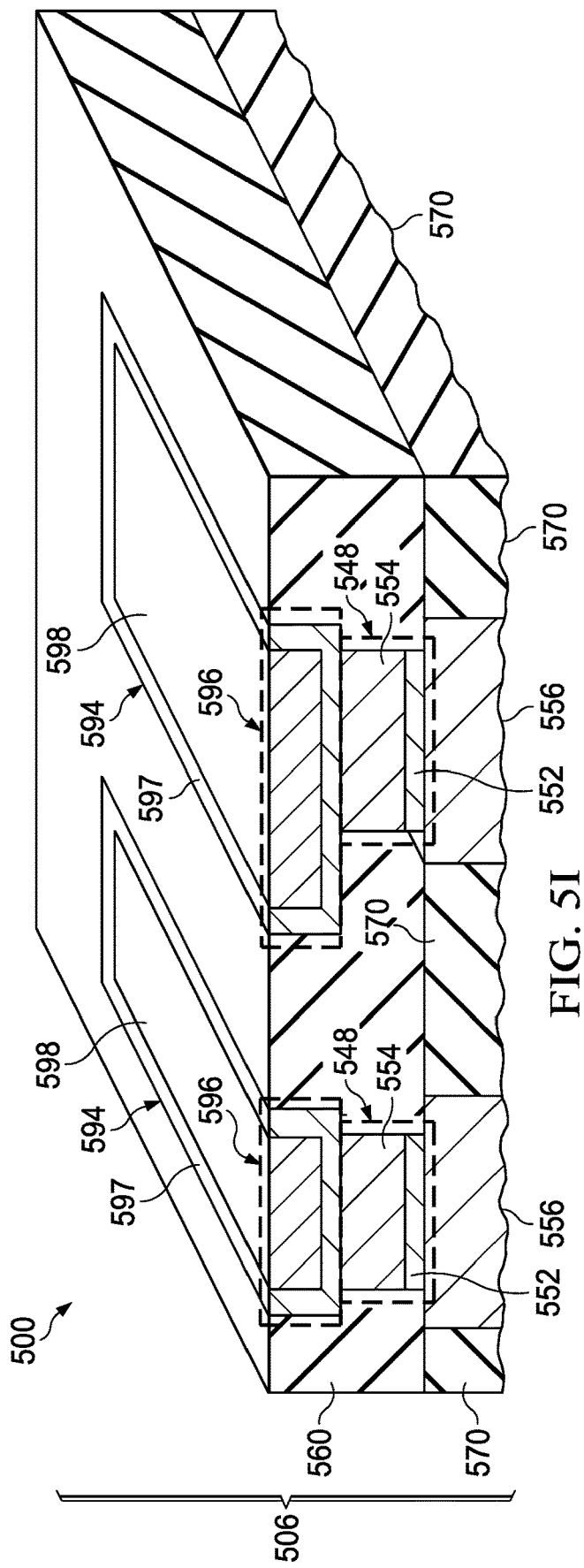

Referring to FIG. 5I, damascene interconnects 596 are formed in the interconnect trenches 594. One or more of the damascene interconnects 596 may contact one or more of the graphitic vias 548, as depicted in FIG. 5I. The damascene interconnects 596 may include a metal liner 597 formed on bottoms and sidewalls of the interconnect trenches 594, and fill metal 598 formed on the metal liner 597. In one manifestation of the instant example, the metal liner 597 may include tantalum and/or tantalum nitride, and the fill metal 598 may include copper. Forming the graphitic vias 548 to extend vertically above the first dielectric layer 570, and subsequently forming the second dielectric layer 560 over the graphitic vias 548 may facilitate integration of the graphitic vias 548 into fabrication sequences using damascene interconnects, thus advantageously reducing a fabrication cost of the integrated circuit 500.

Figure 6:
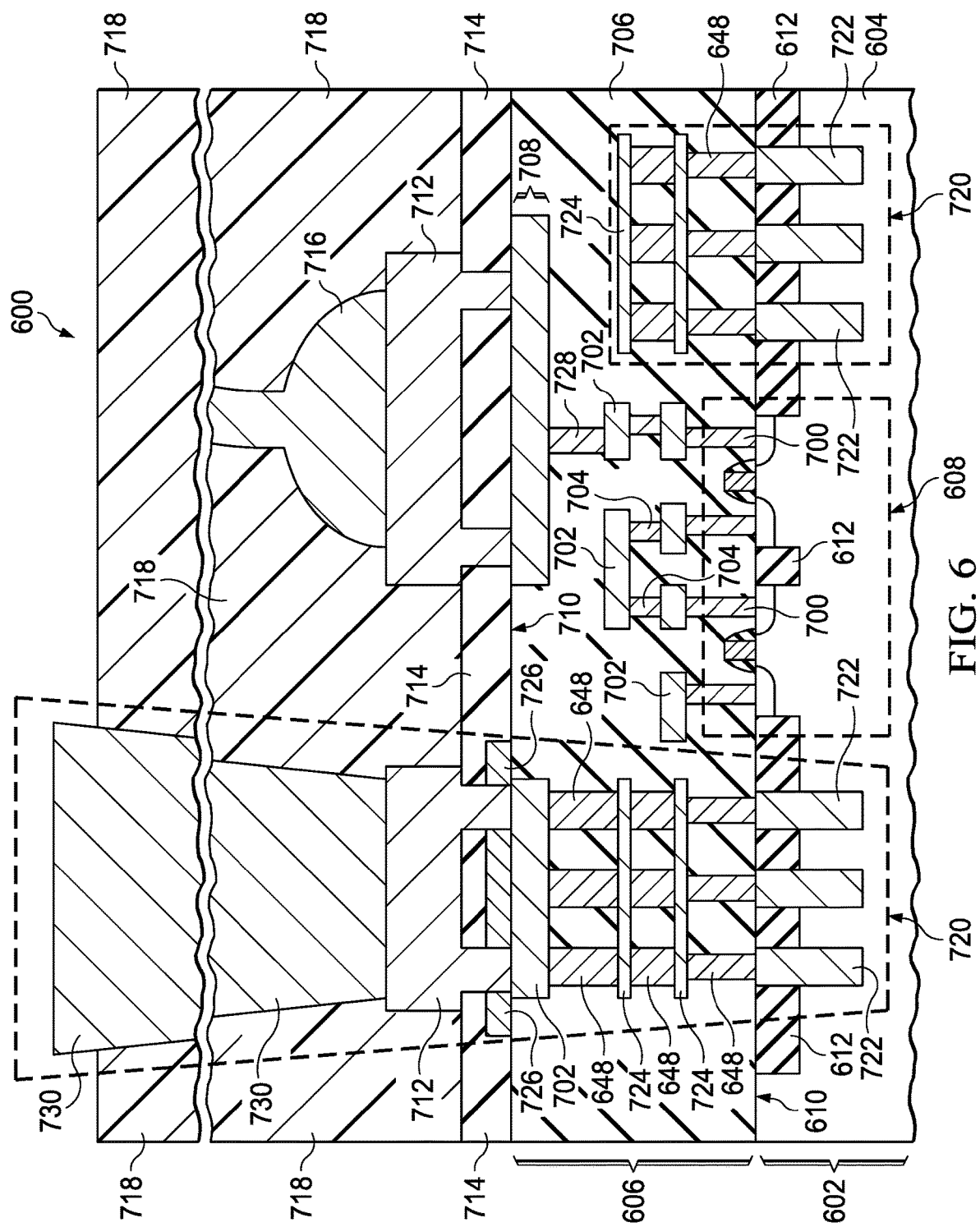
FIG. 6 is a cross section of an example integrated circuit which includes a combined thermal routing structure according to an embodiment of the invention.

FIG. 6 is a cross section of an example integrated circuit which includes a combined thermal routing structure according to an embodiment of the invention. The integrated circuit 600 includes a substrate 602 comprising a semiconductor material 604. The integrated circuit 600 further includes an interconnect region 606 disposed above the substrate 602. Active components 608 are disposed in the substrate 602 and the interconnect region 606, at a boundary 610 between the substrate 602 and the interconnect region 606. The active components 608 may be, for example, MOS transistors, bipolar junction transistors, JFETs, and/or SCRs. The active components 608 may be laterally separated by field oxide 612 at the boundary 610 between the substrate 602 and the interconnect region 606.

The interconnect region 606 may include contacts 700, interconnects 702 and vias 704 disposed in a dielectric layer stack 706. Some of the interconnects 702 are disposed in a top interconnect level 708 which is located at a top surface 710 of the interconnect region 606. The top surface 710 of the interconnect region 606 is located at a surface of the interconnect region 606 opposite from the boundary 610 between the substrate 602 and the interconnect region 606. Bond pad structures 712 may be disposed over the top surface 710, and are electrically coupled to the interconnects 702 in the top interconnect level 708. A protective overcoat 714 is disposed over the top surface 710 of the interconnect region 606. In the instant example, the integrated circuit 600 may be assembled using wire bonds 716 on some of the bond pad structures 712. The integrated circuit 600 is packaged by encapsulation in an encapsulation material 718. The encapsulation material 718, which may be an epoxy for example, is disposed over the protective overcoat 714 and the bond pad structures 712.

The integrated circuit 600 of the instant example includes the combined thermal routing structure 720, which extends from inside the substrate 602 through the interconnect region 606, and through the organic polymer encapsulation material 718. The combined thermal routing structure 720 may conduct heat generated by the components 608 to a heat removal apparatus, such as a heat sink, not shown in FIG. 6, located outside of a package containing the integrated circuit 600, which may advantageously reduce an operating temperature of the components 608. The combined thermal routing structure 720 includes a plurality of graphitic vias 648 disposed in the interconnect region 606 according to any of the examples disclosed herein.

The combined thermal routing structure 720 may include a thermal routing trench 722 disposed in the substrate 602. The thermal routing trench 722 may surround a portion of the components 608 and may be connected to each other at locations out of the plane of FIG. 6. The thermal routing trench 722 may have a structure and may be formed, for example, as described in the commonly assigned patent application having patent application Ser. No. 15/361,397, filed simultaneously with this application, and which is incorporated herein by reference.

The combined thermal routing structure 720 may include an interconnect region thermal routing structure 724 disposed in the interconnect region 606. The interconnect region thermal routing structure 724 may surround a portion of the components 608 and may be connected to each other at locations out of the plane of FIG. 6. The interconnect region thermal routing structure 724 may have a structure and may be formed, for example, as described in the commonly assigned patent application having patent application Ser. No. 15/361,394, filed simultaneously with this application, and which is incorporated herein by reference.

The combined thermal routing structure 720 may include a top level thermal conductivity structure 726 disposed above the top interconnect level 708. The top level thermal conductivity structure 726 may have a structure and may be formed, for example, as described in the commonly assigned patent application having patent application Ser. No. 15/361,390, filed simultaneously with this application, and which is incorporated herein by reference.

The combined thermal routing structure 720 may include high thermal conductivity vias 728 disposed in the interconnect region 606. The high thermal conductivity vias 728 may have structures and may be formed, for example, as described in the commonly assigned patent application having patent application Ser. No. 15/361,399, filed simultaneously with this application, and which is incorporated herein by reference.

The combined thermal routing structure 720 may include high thermal conductivity through-package conduits 730 disposed through the encapsulation material 718 to the integrated circuit 600. The high thermal conductivity through-package conduits 730 may have structures and may be formed, for example, as described in the commonly assigned patent application having patent application Ser. No. 15/361,403, filed simultaneously with this application, and which is incorporated herein by reference.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising:
    forming an interconnect region above a semiconductor substrate;
    forming a first electrically conductive member within the interconnect region;
    forming a graphitic via in the interconnect region, wherein forming the graphitic via comprises:
        dispensing a nanoparticle ink by an additive process to form a nanoparticle ink film, wherein:
            the nanoparticle ink film comprises nanoparticles and a carrier fluid; and
            the nanoparticles comprise a metal suitable for catalysis of graphitic material;
        inducing cohesion of the nanoparticles to form a cohered nanoparticle film on at least one sidewall of the graphitic via, wherein the cohered nanoparticle film makes electrical contact to the first electrically conductive member in the interconnect region; and
        forming a layer of graphitic material on the cohered nanoparticle film; and
    forming a second electrically conductive member in the interconnect region, wherein the second electrically conductive member makes electrical contact to the cohered nanoparticle film and to the layer of graphitic material.

2. The method of claim 1, wherein forming the graphitic via further comprises heating the nanoparticle ink film to remove a volatile material from the nanoparticle ink film to form a nanoparticle film, prior to inducing cohesion of the nanoparticles.

3. The method of claim 2, wherein heating the nanoparticle ink film comprises applying radiant energy from radiant light source.

4. The method of claim 1, wherein forming the graphitic via further comprises forming a via hole in a dielectric layer of the interconnect region, prior to forming the nanoparticle ink film, wherein the nanoparticle ink film is formed in the via hole, and wherein the graphitic material is formed in the via hole.

5. The method of claim 1, wherein forming the interconnect region further comprises:
    forming a dielectric layer over the graphitic via, wherein the dielectric layer contacts sides of the graphitic via; and
    planarizing the dielectric layer.

6. The method of claim 5, further comprising forming the second electrically conductive member in a trench in the dielectric layer.

7. The method of claim 1, wherein the nanoparticles comprise a metal selected from the group consisting of copper, nickel, palladium, platinum, iridium, rhodium, cerium, osmium, molybdenum, and gold.

8. The method of claim 1, wherein the graphitic material comprises a material selected from the group consisting of graphite, graphitic carbon, graphene, and carbon nanotubes.

9. The method of claim 1, wherein the additive process comprises a process selected from the group consisting of a discrete droplet dispensing process, a continuous extrusion process, a direct laser transfer process, an electrostatic deposition process, and an electrochemical deposition process.

10. The method of claim 1, wherein inducing cohesion of the nanoparticles comprises a process selected from the group consisting of a scanned laser heating process, a flash heating process and a spike heating process.

11. The method of claim 1, wherein the cohered nanoparticle film is essentially free of an organic binder material.

12. The method of claim 1, wherein the first electrically conductive member is electrically coupled to the active component.

13. The method of claim 1, wherein forming the layer of graphitic material comprises forming the layer of graphitic material on the cohered nanoparticle film by a plasma enhanced chemical vapor deposition (PECVD) process.

14. A method of forming an integrated circuit, comprising:
    forming first and second dielectric layers over a semiconductor substrate;
    forming a first metal interconnect line within a first dielectric layer and located over the substrate;
    forming a second metal interconnect line within a second dielectric layer and located over the substrate;
    forming a conductive via comprising a graphitic material within a third dielectric layer located between the first and second dielectric layers; and
    forming a cohered nanoparticle film located between the graphitic material and the first metal interconnect line and between the graphitic material and the third dielectric layer.

15. The method of claim 14, wherein the nanoparticle film comprises a metal selected from the group consisting of copper, nickel, palladium, platinum, iridium, rhodium, cerium, osmium, molybdenum, and gold.

16. The method of claim 14, wherein the graphitic material comprises a plurality of graphene layers.

17. The method of claim 14, wherein adjacent nanoparticles in the nanoparticle film are cohered to each other.

18. The method of claim 14, wherein the graphitic material comprises a material selected from the group consisting of graphite, graphitic carbon, graphene, and carbon nanotubes.

19. A method of forming an integrated circuit, comprising:
    forming first and second dielectric layers over a semiconductor substrate;
    forming a first metal interconnect line within a first dielectric layer and located over the substrate;
    forming a second metal interconnect line within a second dielectric layer and located over the substrate;
    forming a conductive via comprising a graphitic material within a third dielectric layer located between the first and second dielectric layers;
    forming a nanoparticle film located between the graphitic material and the first metal interconnect line and between the graphitic material and the third dielectric layer; and
    forming a graphitic via in the interconnect region, wherein forming the graphitic via comprises dispensing a nanoparticle ink by an additive process to form a nanoparticle ink film, wherein the nanoparticle ink film comprises nanoparticles and a carrier fluid, and the nanoparticles comprise a metal suitable for catalysis of graphitic material.

20. The method of claim 19, wherein the additive process comprises a process selected from the group consisting of a discrete droplet dispensing, process, a continuous extrusion process, a direct laser transfer process, an electrostatic deposition process, and an electrochemical deposition process.

* * * * *